(12) United States Patent  
Nogami et al.

(10) Patent No.: US 8,262,846 B2
(45) Date of Patent: Sep. 11, 2012

(54) PLASMA PROCESSING APPARATUS AND METHOD THEREOF

(75) Inventors: Mitsuhide Nogami, Hachioji (JP); Eiji Miyamoto, Hachioji (JP)

(73) Assignee: Sekisui Chemical Co., Ltd., Osaka (JP)

( * ) Notice: Subject to any disclaimer, the term of this patent is extended or adjusted under 35 U.S.C. 154(b) by 1310 days.

(21) Appl. No.: 11/932,330

(22) Filed: Oct. 31, 2007

(65) Prior Publication Data

US 2008/0237186 A1    Oct. 2, 2008

Related U.S. Application Data

(62) Division of application No. 10/547,078, filed on Aug. 26, 2005, now Pat. No. 7,332,039.

(30) Foreign Application Priority Data

| Mar. 6, 2003 | (JP) | 2003-060285 |
| Mar. 6, 2003 | (JP) | 2003-060286 |
| Aug. 28, 2003 | (JP) | 2003-304897 |
| Nov. 6, 2003 | (JP) | 2003-377383 |
| Nov. 6, 2003 | (JP) | 2003-377385 |

(51) Int. Cl.
*C23C 16/00* (2006.01)
*C23C 16/50* (2006.01)
*C23F 1/00* (2006.01)
*H01L 21/306* (2006.01)

(52) U.S. Cl. ........... 156/345.43; 156/345.1; 118/715; 118/722; 118/723 R; 118/723 E

(58) Field of Classification Search ............ 118/715, 118/722, 723 R, 723 HC, 723 DC; 156/345.1, 156/345.33
See application file for complete search history.

(56) References Cited

U.S. PATENT DOCUMENTS

| 5,565,249 A | * | 10/1996 | Kurihara et al. ............ 427/577 |
| 5,567,255 A | | 10/1996 | Steinberg |
| 6,004,631 A | * | 12/1999 | Mori ............................. 427/534 |
| 6,063,235 A | * | 5/2000 | Taylor ...................... 156/345.33 |

(Continued)

FOREIGN PATENT DOCUMENTS

EP       0707337 A      4/1996

(Continued)

OTHER PUBLICATIONS

Chinese Office Action corresponding to Chinese Patent Application No. 200710169239.1, dated Apr. 13, 2010.

(Continued)

*Primary Examiner* — Maureen Gramaglia
*Assistant Examiner* — Tiffany Nucklos
(74) *Attorney, Agent, or Firm* — Sughrue Mion, PLLC

(57) ABSTRACT

A blow-off part 152 is provided with a blow-off port 1$a'$ which is dimensioned small enough so as not to allow a blow-off stream to be blown off directly to a part of a wafer W which part is located at the more internal side of the wafer than the outer edge of the wafer W and not to be subjected to plasmatizing process. A suction part 151 is provided with a suction port 81A in associating with the blow-off part 152. The suction port 81A is disposed proximate to the blow-off port 1$a'$ and forms a suction stream oriented generally in the reverse direction with respect to the blow-off stream.

12 Claims, 19 Drawing Sheets

U.S. PATENT DOCUMENTS

| | | |
|---|---|---|
| 6,067,930 A | 5/2000 | Minato et al. |
| 6,086,710 A * | 7/2000 | Miyashita et al. ........ 156/345.34 |
| 6,521,048 B2 * | 2/2003 | Miller et al. .................. 118/729 |
| 2001/0019472 A1 | 9/2001 | Kanno et al. |

FOREIGN PATENT DOCUMENTS

| | | |
|---|---|---|
| JP | 03-268409 A | 11/1991 |
| JP | 05-082478 A | 4/1993 |
| JP | 08-279494 A | 10/1996 |
| JP | 08-279494 A | 11/1996 |
| JP | 09-275097 A | 10/1997 |
| JP | 10-189515 A | 7/1998 |
| JP | 11-274147 A | 10/1999 |
| JP | 2000-216141 A | 8/2000 |
| JP | 2002-176050 A | 6/2002 |
| JP | 2003-197397 A | 7/2003 |
| JP | 2003-338399 A | 11/2003 |
| JP | 2004-096986 A | 3/2004 |

OTHER PUBLICATIONS

European Search Report dated Oct. 31, 2008.

\* cited by examiner

US 8,262,846 B2

PLASMA PROCESSING APPARATUS AND METHOD THEREOF

This is a divisional of application Ser. No. 10/547,078 filed Aug. 26, 2005 now U.S. Pat. No. 7,332,039. The entire disclosure(s) of the prior application(s), application Ser. No. 10/547,078 is hereby incorporated by reference.

TECHNICAL FIELD

This invention relates to a plasma processing apparatus and a method thereof, in which various surface processing, such as workpiece (object to be processed) etching, chemical vapor deposition (CVD), cleaning, ashing, surface modification and the like are carried out by plasmatizing a processing gas and applying the plasmatized gas to a workpiece such as a semiconductor wafer.

BACKGROUND ART

A semiconductor wafer is, for example, subjected to an etching process via deposition process (film forming process) using a spin coater or the like. The spin coater is a device for forming a thin film such as an insulating film and a photoresist film on the semiconductor wafer. The semiconductor wafer is rotated and a material liquid is dropped on to a central part of an upper surface (front surface) of the wafer, so that the material liquid is spread over the entire surface by centrifugal force. By doing this, a thin film covers not only the main area (the inner side area) of the upper surface of the wafer but also the outer edge part of the upper surface and the outer end face. Should this film occupying the outer edge of the wafer be allowed to remain, it could be a cause for generating particles, for example, in the process for holding the outer edge. Moreover, the film becomes larger in thickness at the outer edge of the wafer than at the main area due to resistance of the liquid stream. This not only results in inconvenience at the time of polishing the film surface but also tends to cause contamination due to peel-off.

In the case of deposition according to PE-CVD and LP-CVD, it is seldom that the film becomes large in thickness at the outer edge of the film, but there is a possibility that crack occurs when the outer edge of the wafer is accidentally contacted during the transferring process, thus resulting in contamination.

In the field of the present leading LSI device, Cu/low -k is the main stream in order to realize high speed operation. In this technology, copper having high electron mobility is used as metal wiring, and a low dielectric film having a lower dielectric constant than $SiO_2$ (dielectric constant: 4) is used as an interlayer insulating film. However, it is said that the low dielectric film is smaller in mechanical strength than $SiO_2$ and therefore, that the film formed on the outer edge of the wafer is liable to be a cause for occurring contamination in a physical polishing process such as CMP (chemical mechanical polishing).

Such contamination is liable to become the cause for such an inconvenience as short circuit of the wiring, and this often results in reduced yield of product. As the miniaturization of semiconductor is developed, the wiring is reduced in thickness and thus readily subject to the adverse effect of contamination. Therefore, it is required to more strictly restrain the occurrence of contamination.

In view of the above, Japanese Patent Application Laid-Open Nos. H03-268419 and H11-274147 teach that a so-called wet etching technique in which an etching liquid is dropped on to the non-required film formed on the outer edge of a wafer in order to remove the no-required film therefrom after the end of the process for forming a film on the upper surface of the wafer.

However, the method for removing a film on the outer edge of a wafer according to the above-mentioned wet etching technique has such inconveniences that not only the film formed on the outer edge but also the film formed on the main area become brittle by moisture of the etching liquid and a huge cost is required for processing the exhaust liquid. Although it is desirous that the outer end face of the film is formed in a slope configuration in order to disperse stress at the time of physical polishing, the outer end face of the film becomes a sharpened edge-like configuration according to the wet etching technique, thus making it difficult to obtain the slope-like configuration.

In contrast, Japanese Patent Application Laid-Open Nos. H05-82478, H08-279494 and H10-189515 and some others propose a technique for removing the film formed on the outer edge of a wafer in accordance with a-so-called dry etching technique using plasma.

In general, a plasma processing apparatus comprises a pair of electrodes. For example, in a plasma processing apparatus for etching illustrated in FIG. 5 of Japanese Patent Application Laid-Open No. H05-82478, a dielectric is wound on each of a pair of concentric dielectric cylinder to provide a double annular electrode structure. An annular gap is formed between the inner and outer annular electrodes, and this annular gap serves as a gas passage for allowing a processing gas to flow therethrough. By imparting an electric field between the electrodes, the gas passage is turned out to be a plasmatizing space where the processing gas is plasmatized. This plasmatized processing gas is blown off through the entire periphery of the annular gas passage. This makes it possible to etch the entire periphery of the outer edge of the disc-like wafer at a time.

Moreover, in the apparatus illustrated in FIG. 1 of the above-mentioned Laid-Open document No. H05-82478, a pipe bent in the C-shape is received in an annular groove which is formed in the electrode unit and allowed to contact an annular electrode, and then, a coolant as a temperature adjusting medium is flowed into this pipe to cool (temperature adjustment) the electrode.

Moreover, in the apparatus disclosed in the above-mentioned Laid-Open document No. H05-82478, a wafer is sandwichingly held at both the front and back sides thereof by a pair of disc-like chucking means. By this, the main areas at both the front and back surfaces of the wafer are covered and the outer edge of the wafer is exposed. Each chucking means is provided at a peripheral edge thereof with an O-ring. This O-ring is pressed against the boundary area between the main area and the outer edge of the front and back surfaces of the wafer. By this, sealing is provided so that the plasma gas will not flow to the main area. The exposed outer edge of the wafer is faced with the interior of the annular closed clearance. By supplying the plasmatized processing gas into this closed clearance, the film formed on the outer edge of the wafer is removed.

Moreover, in the apparatus disclosed in the above-mentioned Laid-Open document No. H05-82478, an exhaust means is separately employed from the above-mentioned processing gas blow-off means. This exhaust means includes an annular suction port disposed proximate to the outer edge of the wafer and connected to the annular closed clearance, and an exhaust passage connected to the annular suction port. The processing gas and the byproduct are sucked through the suction port and exhausted through the exhaust passage.

The apparatus disclosed in the above-mentioned Japanese Patent Application Laid-Open No. H08-279494 includes an annular electrode structure and therefore, an annular plasma blow-off port. The wafer is disposed below the annular blow-off port such that the outer edge of the wafer extends along the port. An electric field is imparted between the annular electrodes, so that the processing gas passing between the electrodes is plasmatized and the plasmatized processing gas is blown off through the annular blow-off port. The plasmatized gas thus blown off is contacted with the outer edge part of the upper surface of the wafer, then traveled downward along the outer edge surface and turned toward the back side. By this, the film formed on the outer edge (including the outer edge part of the upper surface, the outer end face and the outer edge part of the lower surface) of the wafer is removed. Thereafter, the gas is sucked and exhausted from the lower part of the wafer. By separately spraying a carrier gas on to a central area of the wafer and radially spreading the gas, the plasma sprayed on to the outer edge of the wafer is prohibited from flowing to the inner side (i.e., main area of the wafer).

In the apparatus, disclosed in the Japanese Patent Application Laid-Open No. H10-189515, the electrode structure and thus, the plasma blow-off port are directed upward and arranged at a lower part of the outer edge of the wafer.

The conventional plasma processing apparatus, particularly, the plasma processing apparatus comprising an annular electrode structure has the following problems.

(a) Assembling/Centering of Annular Electrode

Electrodes are often required to be attached/detached for cleaning when they become dirty, or for replacement when they are damaged. If some clearance is not formed between each electrode and the holder at that time, the detaching/assembling operation is difficult to carry out. However, if some clearance should be provided in a double annular electrode structure, precision of the attaching position of the electrodes would readily be disordered and the centers of the inner and outer electrodes would be displaced from each other.

(b) Cooling (Temperature Adjustment) of Annular Electrode

In order to occur a glow discharge in a stable manner and thus, in order to carry out the plasmatization (conversion of a processing gas into plasma) in a stable manner, the electrodes are required to be maintained in a predetermined temperature range by means of such temperature adjustment as cooling. On the other hand, in case the electrodes are annular, it is not easy to form a cooling passage for temperature adjustment at the inside of the electrodes. According to the apparatus disclosed in the above-mentioned Laid-Open document No. H05-82478, manufacture is easy because the cooling structure (temperature adjustment structure) is separately formed from the electrodes. However, heat exchange is carried out between the coolant and the electrode through a tube wall of the coolant tube. In case the contact area with the electrode is small, fully satisfactory cooling efficiency (temperature adjusting efficiency) is unobtainable.

Moreover, for example, in the double annular electrode structure, in case a coolant tube extending in the inner peripheral surface is disposed at the inner peripheral surface of the inner electrode and a coolant tube extending in the peripheral direction is disposed at the outer peripheral surface of the outer electrode, if the coolant tubes are unchanged in curvature along the peripheral surfaces of the electrodes and non-expansible/non-contractible, the disassembling/assembling operation is encountered with difficulty at the time of maintenance. On the other hand, it is required that the electrodes and the coolant tubes are firmly contacted with each other when in use and the heat transfer property is maintained.

(c) Exhaust of Processed Gas and Byproduct

The used processing gas and the byproduct film generated by etching are required to be removed rapidly because if not, they can prevail such adverse effect as staying on the wafer. However, in case the blow-off port and exhaust port of the processing gas are located overly away from each other, the gas flow is difficult to control and an exhaust pump having a large capacity is required. In case an exhaust passage is formed in the frame of the apparatus, there is such a fear that the inner peripheral surface of the frame gets corrosion. Any attempt to make the frame from a corrosion-resistant metal results in high cost.

The apparatus disclosed in the Japanese Patent Application Laid-Open No. H05-82478 has such disadvantages that a chip located at an area sandwichingly held by the O-ring of the pair of chucking means is liable to be damaged, and that the film formed on this area is liable to split, thus generating fine dusts, which can be a cause for contamination. Moreover, since a housing for forming an annular closed clearance is required radially outwardly of the wafer, the apparatus becomes large in size. This makes it difficult to employ as a replacement of the wet etching mechanism of the conventional spin coater.

According to the apparatus disclosed in Japanese Patent Application Laid-Open No. H08-279494, the plasma and the carrier gas are converged at the outer edge of the wafer. This makes it difficult to control the flow of those gases, and thus, it is difficult to remove the film formed on the outer edge with precision. If any attempt is made to stop the carrier gas, there is such a fear that the plasma enters not only the outer edge of the wafer but also the area which is located at the inner side of the outer edge and which is not to be processed. Thus, there is a possibility that even the film formed on the area which is not to be removed is removed.

DISCLOSURE OF THE INVENTION (1) First Feature of the Invention

According to a first feature of the present invention, there is provided a plasma processing apparatus in which a processing gas is plasmatized (including activated, ionized and radicalized) and the plasmatized gas is applied to a workpiece, the apparatus comprising an annular inner holder (inner electrode support part); an annular inner electrode having a larger diameter than the inner holder and surrounding the inner holder; an annular outer electrode having a larger diameter than the inner electrode and surrounding the inner electrode; and an annular outer holder (outer electrode support part) having a larger diameter than the outer electrode and surrounding the outer electrode, the outer holder being, for example, concentrically fixed in position with the inner holder; the inner holder being provided with a plurality of inner pushers, the inner pushers being spacedly arranged in the peripheral direction of the inner holder and adapted to push the inner electrode radially outwardly; the outer holder being provided with a plurality of outer pushers, the outer pushers being spacedly arranged in the peripheral direction of the outer holder and adapted to push the outer electrode radially inwardly. The inner electrode is supported by the inner holder through a plurality of inner pushers, and the outer electrode is supported by the outer holder through a plurality of outer pushers.

According to this first feature, clearances can be formed each between the respective inner and outer annular electrodes and the holder. This makes it easy to carry out the removing and assembling operation with ease. Moreover, since the positional adjustment, i.e., centering of the electrode with respect to the corresponding holder can be made by the pushers, precision of the attaching position can satisfactorily be obtained.

It is desirable that the inner holder has a plurality of female screw holes (bolt holes) which are peripherally spacedly formed in the inner holder such that axes of the female screw holes are directed radially, and the inner pushers are screw members such as bolts which are threadingly engaged with the corresponding female screw holes of the inner holder and whose distal ends are abutted with the inner electrode, the outer holder has a plurality of female screw holes (bolt holes) which are peripherally spacedly formed in the outer holder such that axes of the female screw holes are directed radially, and the outer pushers are screw members such as bolts which are threadingly engaged with the corresponding female screw holes of the outer holder and whose distal ends are abutted with the outer electrode. Owing to this arrangement, the pushers can be simplified in structure.

It is desirable that a thermal conductive inner temperature adjusting member is interposed between the inner holder and the inner electrode, the inner temperature adjusting member has an expansible and contractible C-shaped configuration (partly cutaway annular configuration) and includes an inner medium passage for allowing a temperature adjusting medium for the inner electrode to pass therethrough, and the inner pushers push the inner electrode through the inner temperature adjusting member, thereby pressing the inner temperature adjusting member against an inner peripheral surface of the inner electrode, a thermal conductive outer temperature adjusting member is interposed between the outer electrode and the outer holder, the outer temperature adjusting member has an expansible and contractible C-shaped configuration (partly cutaway annular configuration) and includes an outer medium passage for allowing a temperature adjusting medium for the outer electrode to pass therethrough, and the outer pushers push the outer electrode through the outer temperature adjusting member, thereby pressing the outer temperature adjusting member against an outer peripheral surface of the outer electrode.

According to this construction, since the temperature adjusting member can be pressed against the electrode instead of being merely contacted with the electrode, thermal transmission between the temperature adjusting member and the electrode can be enhanced and the inner and outer electrodes can reliably be adjusted in temperature. Moreover, since it is not necessary to form a medium passage in the annular electrode itself, manufacturing can be made with ease. Since the inner and outer temperature adjusting members have each an expansible and contractible C-shaped configuration, they can reliably be pressed against the corresponding electrodes and thermal transmission between the temperature adjusting members and the electrodes can reliably be enhanced. Moreover, the operation for removing, assembling and centering the electrodes can be carried out without any inconvenience.

It is desirable that both the inner and outer temperature adjusting members have a conductive property and one of the temperature adjusting members is connected with an electric power supply and the other temperature adjusting member is grounded to the earth.

Owing to this arrangement, through the temperature adjusting member, the electrode can be connected with the electric power supply and grounded to the earth. Moreover, since the temperature adjusting member is pressed against the corresponding electrode instead of being merely contacted with the electrode, electric conduction between the temperature adjusting member and the electrode can reliably be enhanced.

(2) Second Feature of the Invention

According to a second feature of the present invention, there is provided a plasma processing apparatus in which a processing gas is plasmatized and the plasmatized gas is applied to a workpiece, the apparatus comprising an annular inner electrode; an annular outer electrode having a larger diameter than the inner electrode and surrounding the inner electrode; a thermal conductive inner temperature adjusting member, which includes an inner medium passage for allowing a temperature adjusting medium for the inner electrode to pass therethrough and which has a C-shaped configuration (partly cutaway annular configuration), the thermal conductive inner temperature adjusting member being capable of expansion and contraction between a first position where the member is abutted with an inner peripheral surface of the inner electrode and a second position where the member is contracted in diameter in such a manner as to be radially inwardly separated from the inner peripheral surface of the inner electrode; a thermal conductive outer temperature adjusting member, which includes an outer medium passage for allowing a temperature adjusting medium for the outer electrode to pass therethrough and which has a C-shaped configuration (partly cutaway annular configuration), the thermal conductive outer temperature adjusting member being capable of expansion and contraction between a first position where the member is abutted with an outer peripheral surface of the outer electrode and a second position where the member is expanded in diameter in such a manner as to be radially outwardly separated from the outer peripheral surface of the outer electrode.

According to this second feature, it is not necessary to form a medium passage in the annular electrode because the temperature adjusting member is separately made from the electrode, and thus, the electrode can be manufactured with ease. Moreover, thermal conduction between the temperature adjusting member and the electrode can be enhanced by pressing the temperature adjusting member against the electrode, and the electrode can reliably be adjusted in temperature. In addition, the operation for assembling and disassembling the temperature adjusting member and the electrode can be carried out with ease by expanding or contracting the temperature adjusting member in diameter.

It is desirable that the inner temperature adjusting member includes an inner heat transfer plate having a C-shaped configuration and abutted with the inner peripheral surface of the inner electrode, and an inner tube part fixed to an inner peripheral surface of the inner heat transfer plate in such a manner as to extend in the peripheral direction of the inner heat transfer plate, and constituting the inner medium passage. It is also preferable that the outer temperature adjusting member includes an outer heat transfer plate having a C-shaped configuration and abutted with the outer peripheral surface of the outer electrode, and an outer tube part fixed to an outer peripheral surface of the outer heat transfer plate in such a manner as to extend in the peripheral direction of the outer heat transfer plate, and constituting the outer medium passage. Owing to the foregoing arrangement, the medium passage can be constituted with ease and thermal transmission can reliably be obtained by enlarging the thermal transmission area with respect to the electrode. Thus, temperature adjusting efficiency can further be enhanced.

It is desirable that a plurality of the tube parts are arranged, side by side, in the width direction (direction orthogonal to both the peripheral direction and the radial direction (thickness direction)) of the heat transfer plate, respective end parts on the same side of the plurality of tube parts are connected to each other at one end part in the peripheral direction of the heat transfer plate. Owing to this arrangement, the tube parts can be extended widely over the heat transfer plate and heat adjusting efficiency can further be enhanced.

It is desirable that the inner temperature adjusting member includes an inner heat transfer plate having a C-shaped configuration and abutted with the inner peripheral surface of the inner electrode, and an inner tube part fixed to an inner peripheral surface of the inner heat transfer plate in such a manner as to extend in the peripheral direction of the inner heat transfer plate, and constituting the inner medium passage, the outer temperature adjusting member includes an outer heat transfer plate having a C-shaped configuration and abutted with the outer peripheral surface of the outer electrode, and an outer tube part fixed to an outer peripheral surface of the outer heat transfer plate in such a manner as to extend in the peripheral direction of the outer heat transfer plate, and constituting the outer medium passage, one end part of the inner tube part is connected to one end part of the outer tube part through a connecting tube, and the other end part of the inner tube part is connected to a supply tube and an exhaust tube of the temperature adjusting medium, and the other end part is connected to the other end of the supply tube and the exhaust tube. Owing to this arrangement, the inner and outer tube parts can be connected to each other in series, and thus, temperature can be adjusted by pass the medium through the inner electrode and the outer electrode in this order or through the outer electrode and the inner electrode in this order.

It is desirable that the plasma processing apparatus further comprises an annular inner holder (inner support part) surrounded with the inner temperature adjusting member, and an outer holder (outer support part) surrounding the outer temperature adjusting member and fixed in position with the inner holder, the inner holder being provided with a plurality of inner pushers spacedly arranged in the peripheral direction and adapted to push the inner temperature adjusting member in the diameter-enlarging direction by being abutted with the inner temperature adjusting member, the inner pushers being capable of retracting toward the inner holder, the outer holder being provided with a plurality of outer pushers spacedly arranged in the peripheral direction and adapted to push the outer temperature adjusting member in the diameter-reducing direction by being abutted with the outer temperature adjusting member, the outer pushers being capable of being retracted toward the outer holder. The inner electrode is supported by the inner holder through the plurality of inner pushers, and the outer electrode is supported by the outer holder through the plurality of outer pushers. By this, the temperature adjusting member can reliably be pressed against the electrode and thermal transmission between the temperature adjusting member and the electrode can reliably be enhanced. Thus, temperature adjusting efficiency of the electrode can reliably be enhanced. Moreover, by retracting the pushers, the operation for assembling and disassembling the temperature adjusting member and the electrode can be made with ease.

It is desirable that both the inner and outer temperature adjusting members have electric conductive properties, one of the inner and outer temperature adjusting members is connected with an electric power supply, and the other is grounded to the earth. Owing to this arrangement, through the temperature adjusting member, the electrode can be connected to the electric power supply and grounded to the earth. Thus, the electric power supplying and grounding structure of the annular electrode can be simplified. Moreover, since the temperature adjusting member is pressed against the corresponding electrode instead of being merely contacted with the electrode, electric conduction of the temperature adjusting member can reliably be enhanced with respect to the electrode.

(3) Third Feature of the Invention

According to a third feature of the present invention, there is provided an electrode structure in a plasma processing apparatus in which a processing gas is plasmatized and the plasmatized gas is applied to a workpiece, wherein the electrode structure includes an electrode for plasmatizing the processing gas, and a passage formation member disposed adjacent to the electrode, confronting surfaces of the electrode and the passage formation member defining a medium passage for allowing a medium for temperature adjustment to flow therethrough, a first and a second seal member being interposed between the confronting surfaces, the first and second seal members extending along the medium passage in such a manner as to sandwich the medium passage therebetween.

According to this third feature, the medium passage is defined by the confronting surface of the electrode and the temperature adjusting medium flows while directly contacting the electrode. Thus, the temperature adjustment of the electrode can be carried out efficiently.

Preferably, the electrode, passage formation member, and first and second seal members each have an annular configuration, peripheral surfaces of the electrode and passage formation member are provided at least as a part of the confronting surfaces, the medium passage is formed between the peripheral surfaces, and the first seal member is interposed between the peripheral surfaces. Owing to this arrangement, the medium passage can be formed with ease, even if the electrode has an annular configuration. Since the electrode and the passage formation member are arranged one at the outer side and the other at the inner side in the radial direction, miniaturization can be realized.

Preferably, one of the electrode and passage formation member includes an annular flange part radially projected, the flange part having a flat surface orthogonal to the peripheral surface, the other of the electrode and passage formation member
includes a flat surface orthogonal to the peripheral surface and confronting with the flat surface of the flange part, and the flat surfaces are provided as the other confronting surface and allow the second seal member to be sandwiched therebetween. According to this arrangement, the second seal member does not interfere the smooth fitting operation at the time the electrode and the passage formation member are fitted. Thus, the fitting work can be carried out with ease.

More preferably, a peripheral surface of one of the electrode and passage formation member is defined as a continuous cylindrical surface, a peripheral surface of the other of the electrode and passage formation member is provided at an intermediate part thereof with an annular groove which serves as the medium passage, and further provided with a first and a second peripheral surface part which are disposed in such a manner as to sandwich the annular groove therebetween, the first peripheral surface part is confronted with the peripheral surface of the one of the electrode and passage formation member through a gap and attached with the first seal member, and the second peripheral surface part crossing with the flat surface is confronted with the peripheral surface of the one of the electrode and passage formation member substantially without the interposition of any gap. According to this arrangement, since no rattling occurs between the electrode and the passage formation member in the radial direction, centering and positioning of the electrode can be carried out with ease.

Both the first and second seal members may be interposed between the peripheral surfaces of the electrode and passage formation member. According to this arrangement, since the first and second seam members are disposed between the peripheral surfaces, the seal structure can be simplified, and thus, the construction of the electrode and passage formation member can be simplified.

Moreover, according to the third feature of the present invention, the above-mentioned electrode structures are coaxially arranged one at an inner side and the other at an outer side in the radial direction, an inner peripheral surface of an electrode and an outer peripheral surface of a passage formation member are confronted with each other in the inner-side electrode structure, an outer peripheral surface of an electrode and an inner peripheral surface of a passage formation member are confronted with each other in the outer-side electrode structure, and a gap formed between an outer peripheral surface of the electrode in the inner-side electrode structure and an inner peripheral surface of the electrode in the outer-side electrode structure is provided as a gas passage, and a processing gas flowing through the gas passage is plasmatized by electric field imparted between the electrodes. According to this arrangement, by radially concentrically arranging the inner and outer electrodes and the passage formation member, the entire apparatus can be miniaturized and the plasmatized gas can be supplied over the entire periphery.

(4) Fourth Feature of the Invention

According to a fourth feature of the present invention, there is provided a plasma processing apparatus in which a processing gas is plasmatized and the plasmatized gas is applied to a workpiece, the apparatus comprising an annular inner electrode; an annular outer electrode arranged radially outwardly of the inner electrode such that the outer electrode is coaxis with the inner electrode; an insulating holder covering the entire periphery of the inner and outer electrodes; and a frame made of metal and covering the entire periphery of the inner and outer holders; an annular gap formed between an outer peripheral surface of the inner electrode and an inner peripheral surface of the outer electrode being provided as a gas passage, the processing gas flowing through the gas passage being plasmatized by electric field imparted between the electrodes; an annular blow-off port connected to the gas passage being formed at a covered area on the workpiece side of the holder, the plasmatized processing gas being blown off toward the workpiece through the blow-off port; an annular suction port being formed on a covered area on the workpiece side of the frame at an area corresponding to the blow-off port, an exhaust passage for connecting the suction port to a suction device being formed at least at the frame, thereby the processing gas and a byproduct, which is generated during the surface processing of the workpiece using the plasmatized processing gas being exhausted to the suction device from the suction port via the exhaust passage; the exhaust passage including an exhaust tube made of corrosion-resistant resin and allowed to pass through the frame.

According to this fourth feature, since the exhaust passage of a metal-made frame is formed from a corrosion-resistant resin-made exhaust tube, corrosion of the frame can be avoided at a low cost. Moreover, since the means adapted to plasmatize the processing gas and blow off the same and the means adapted to suck the byproduct and the processing gas and exhaust them can be assembled into a single unit, the construction can be simplified.

Preferably, the frame includes a cylindrical outer periphery-side covered part, the exhaust tube being allowed to axially pass through the outer periphery-side covered part. According to this arrangement, the exhaust gas can be guided toward the opposite side to the workpiece. Moreover, even if the covered part on the outer periphery side of the frame is comparative thin, the exhaust passage can be formed by passing the exhaust tube therethrough because the covered part is made of metal. Thus, the apparatus can be miniaturized.

Preferably, the inner electrode serves as an electric field imparting electrode and the outer electrode serves as a grounding electrode; the holder further including a covered area located on the opposite side of the workpiece, and a cylindrical covered area covering the inner peripheral surface of the inner electrode; the frame further including a covered area located on the opposite side of the workpiece, and a cylindrical inner covered area covering the inner peripheral surface of the cylindrical covered area of the holder, the outer periphery-side covered area of the frame being confronted with the outer electrode without the interposition of any insulating material. According to this arrangement, since no insulating material is interposed between the outer electrode and the frame, the apparatus can be more miniaturized. Since the outer electrode is the electrode grounded to the earth, such disadvantage as electrical leakage can be avoided from occurrence.

Preferably, the workpiece-side covered part of the frame is made of corrosion-resistant metal, a gap is formed between the workpiece-side covered part of the frame and the workpiece-side cover part of the holder, and the gap is provided as an exhaust passage for interconnecting the suction port and the exhaust tube. According to this arrangement, the outer-periphery-side exhaust tube and suction tube can be interconnected with a simple construction.

It is desirous that the suction port is disposed proximate to the blow-off port. It is more desirous that the suction port is disposed such that a suction stream sucking through the suction port is oriented generally in the reverse direction with respect to a blow-off stream blown off through the blow-off port. Owing to this arrangement, the processing gas stream can be restrained with ease.

(5) Fifth Feature of the Invention

According to a fifth feature of the present invention, there is provided a plasma processing apparatus in which a processing gas is passed through a gas passage formed between a pair of electrodes and plasmatized, then the plasmatized gas is blown off through a blow-off port connected to the gas passage, so that an outer edge of a wafer is subjected to plasmatizing process, wherein the blow-off port includes a port axis which is intersected with the wafer, the port being dimensioned small enough in diameter or in width so as not to allow the blow-off stream to be blown off directly to a part of the wafer which part is located at the more internal side of the wafer than the outer edge of the wafer and not to be subjected to plasmatizing process, and a suction port for forming a suction stream oriented generally in the reverse direction with respect to the blow-off stream is formed proximate to the blow-off port.

According to this fifth feature, the processing gas can be prevented from flowing to the main area or area not to be subjected to plasmatizing process, and this area not be subjected to plasmatizing process can be protected. Thus, this area not to be subjected to plasmatizing process is not required to be covered, and it not necessary to seal the boundary area between the area not to be subjected to plasmatizing process and the area to be subjected to plasmatizing process. Moreover, the port axis of the blow-off port is intersected with the wafer, those component members such as the electrode, the blow-off port and the suction port are not required to be arranged in such a manner as to be radially greatly projected to the outside of the wafer, and thus, miniaturization can be achieved. Moreover, by forming a suction port for forming a suction stream oriented generally in the reverse direction with respect to the blow-off stream proximate to the blow-off port, the processing gas stream can be controlled with ease, the processing range (processing width) can reliably be controlled such that only the outer edge of the wafer is processed, thus reliably avoiding the possibility that the part (main part) which is located at the more internal side of the outer edge of the wafer and not be to subjected to plasmatizing process, is undesirably processed. This is particularly effective when the plasmatizing process is carried out generally under the normal pressure (proximate to the atmospheric pressure). The term "generally normal pressure" used herein refers to the range from $1.013 \times 10^4$ to $50.663 \times 10^4$ Pa. This range is preferably from $1.333 \times 10^4$ to $10.664 \times 10^4$ Pa and more preferably from $9.331 \times 10^4$ to $10.397 \times 10^4$ Pa when easiness of pressure adjustment and simplification of the apparatus construction are taken into consideration.

The blow-off port may have a spot-like configuration (reduced-diameter port-like configuration); and the suction port may have an annular configuration surrounding the spot-like blow-off port. Owing to this arrangement, the processing range can reliably be controlled.

It is accepted that the blow-off port extends arcuately along the outer edge of the wafer, and the suction port includes at least one of an arcuate outer suction port part extending along the outer edge of the arcuate blow-off port and an arcuate inner suction port part extending along the inner edge of the arcuate blow-off port. Owing to this arrangement, the outer edge of the wafer can be subjected to plasma process over a wide range of area thereof in the peripheral direction at a time and thus, the processing efficiency can be enhanced. In this case, the pair of electrodes desirously have different arcuate configurations in section, having different curvatures from each other.

It is accepted that the blow-off port has an annular configuration along the entire outer edge of the wafer, and the suction port includes at least one of an annular outer suction port part extending along the outer edge of the annular blow-off port and an annular inner suction port part extending along the inner edge of the annular blow-off port. Owing to this arrangement, the entire periphery of the outer edge of the wafer can be subjected to plasma process at a time and thus, the processing efficiency can further be enhanced. In this case, the pair of electrodes desirously have a double annular configuration.

It is desirous that a plasma processing apparatus further comprises a nozzle head for receiving therein the pair of electrodes and having the blow-off port and suction port formed therein; and a rotary device adapted to relatively rotate the nozzle head along the outer edge of the wafer. Owing to this arrangement, the plasma process can be carried out along the outer edge of the wafer. Of course, the nozzle head may be rotated or the wafer may be rotated.

It is desirous that the nozzle head includes a partition wall whose one peripheral surface constitutes a peripheral surface of the blow-off port and whose the other peripheral surface constitutes a peripheral surface of the suction port, the blow-off port and suction port being partitioned by the partition wall, the partition wall being such dimensioned as to be reduced in thickness toward a distal end (wafer side) of the partition wall. Owing to this arrangement, the suction port can reliably be arranged proximate to the blow-off port and thus, the processing gas stream can reliably be controlled.

It is desirous that a distal end edge of the partition wall has a knife edge-like configuration, thereby the blow-off port and suction port are generally contacted with each other at the distal edge of the partition wall Owing to this arrangement, the processing gas stream can more reliably be controlled.

It is desirous that the blow-off port is slightly radially outwardly expanded from the wafer. Owing to this arrangement, not only the outer edge part but also the outer end face of the wafer can be subjected to plasma process.

It is desirous that a plasma processing apparatus further comprises a rotary device adapted to rotate the wafer at a predetermined speed of rotation about a center axis of the wafer. Owing to this arrangement, the processing efficiency can further be enhanced.

It is accepted that a plasma processing apparatus further comprises an air-stream forming device adapted to form an air-stream on an outer edge periphery of the wafer, the air-stream having a predetermined force oriented in the direction away from the wafer. Owing to this arrangement, the processing efficiency can further be enhanced. The predetermined force is desirously large enough to fully allow the blow-off stream through the blow-off port to reach the outer edge of the wafer and to fully scatter the byproduct, etc. generated during the plasma process.

It is desirous that the air-stream forming device is a rotary device adapted to rotate the wafer about the center axis of the wafer. Owing to this arrangement, an air stream directed in the direction away from the wafer can reliably formed on the outer edge periphery of the wafer.

It is desirous that the rotary device includes a wafer support part for supporting the wafer by being abutted with only a back surface of the wafer and a rotation driver to rotate the wafer support part. Owing to this arrangement, the wafer can be rotated without being contacted at the outer surface (surface to be processed) of the wafer.

It is desirous that a plasma processing apparatus further comprises a processing width setting means adapted to set a processing width of the wafer, and a flow rate adjusting means adapted to adjust a flow ratio of the suction flow rate with respect to the blow-off flow rate in accordance with the set processing width. Owing to this arrangement, a desired processing width can reliably be obtained.

It is desirous that a plasma processing apparatus further comprises a working distance adjusting means adapted to adjust an interval, i.e., working distance, between the blow-off port and the wafer. Owing to this arrangement, the processing width, etc. can be adjusted.

In a method according to the fifth feature of the present invention, there is provided a plasma processing method in which a processing gas is plasmatized by allowing the processing gas to pass through a gas passage formed between a pair of electrodes and the plasmatized gas is then blown off to carry out a plasma process with respect to an outer edge of a wafer, wherein a blow-off stream of the processing gas is dimensioned narrow (reduced in diameter or in width) enough so as to be applied to an outer edge of the wafer along the intersecting direction with the wafer and so as not to be blown off directly to a part of the wafer which is located at the more internal side of the wafer than the outer edge of the wafer and which is not to be subjected to plasma process, and at the same time, a suction stream oriented generally in the reverse direction of the blow-off stream is formed proximate to the blow-off stream. Owing to this arrangement, the same effect as in the case with the apparatus according to the fifth feature can be obtained.

It is desirous that the wafer is rotated about a center axis of the wafer while the processing gas is blown off, and the speed of rotation is adjusted in accordance with a desired processing rate. Owing to this arrangement, the processing efficiency can reliably be enhanced.

It is desirous that the flow ratio of the suction flow rate with respect to the blow-off flow rate is adjusted in accordance with a desired processing width.

It is desirous that the interval, i.e., working distance between the blow-off port of the processing gas and the wafer is adjusted in accordance with a desired processing width.

Moreover, in another method according to the fifth feature of the present invention, there is provided a plasma etching method in which an etching processing gas is plasmatized by allowing the etching processing gas to pass through a gas passage formed between a pair of electrodes and the plasmatized gas is then blown off to carry out a plasma etching process with respect to an outer edge of a wafer, wherein a blow-off stream of the etching processing gas is dimensioned narrow enough so as to be applied to an outer edge of the wafer along the intersecting direction with the wafer and so as not to be blown off directly to a part of the wafer which is located at the more internal side of the wafer than the outer edge of the wafer and which is not to be subjected to plasma etching process, and at the same time, a suction stream oriented generally in the reverse direction of the blow-off stream is formed proximate to the blow-off stream. Of course, prior to the etching process, a film forming process for forming a film on the wafer is carried out. This film formation may be carried out in accordance with a plasmatizing method, a low pressure method, or a normal pressure CVD method.

By this, the etching processing gas, which has been plasmatized, can be prevented from flowing to the main area, i.e., area which is not to be subjected to etching process, of the wafer, and the area which is not to be subjected to etching process can be prevented from being etched. Therefore, it is not necessary to cover the area which is not subjected to etching process and thus, it is not necessary to seal the boundary area between the area which is to be subjected to etching process and the area which is not to be subjected to etching process by pressing an O-ring or the like against the boundary area. As a result, fine dust, etc. can be prevented from generating from the pressing area, contamination can reliably be prevented from occurrence, and the yield of production can be enhanced. Moreover, since the blow-off port axis is intersected with the wafer, those component members such as the electrode, the blow-off port and the suction port are not required to be arranged in such a manner as to be radially greatly projected to the outside of the wafer, and thus, miniaturization can be achieved. Therefore, in the photoresist, the apparatus according to the present invention can easily be assembled to the conventional spin coater in such a manner as to be replaced with a wet etching mechanism. Moreover, by forming a suction port for forming a suction stream oriented generally in the reverse direction with respect to the blow-off stream proximate to the blow-off port, the processing gas stream can be controlled with ease, the processing range (processing width) can reliably be controlled such that only the outer edge of the wafer is processed, thus reliably avoiding the possibility that the main area of the wafer is undesirably processed.

It is desirous that the wafer is rotated about a center axis of the wafer while the etching processing gas is blown off, and the speed of rotation is adjusted in accordance with a desired etching rate. Owing to this arrangement, the etching efficiency can reliably be enhanced.

It is desirable that the flow ratio of the suction flow rate with respect to the blow-off flow rate is adjusted in accordance with a desired etching width or etching profile (configuration such as an inclination angle of the peripheral end face of the main area after the etching process). It is also desirous that the interval, i.e., working distance between the blow-off port of the processing gas and the wafer is adjusted in accordance with a desired etching width or profile. By forming a gentle inclination angle, even a low dielectric film or the like that is low in mechanical strength can reliably be prevented from generating contamination at the time surface polishing or the like is applied thereto.

It is desirous that the wafer is supported by a wafer support part which is abutted only with a back surface of the wafer and the blow-off operation is carried out while rotating the wafer support part and therefore, rotating the wafer about a center axis of the wafer. Owing to this arrangement, the wafer can be avoided from being contacted at the outer surface, contamination, etc. can reliably be prevented from occurrence, and the processing efficiency can be enhanced.

BEST MODE FOR CARRYING OUT THE INVENTION

Several embodiments of the present invention will be described hereinafter with reference to the drawings.

First Embodiment

Figure 1:
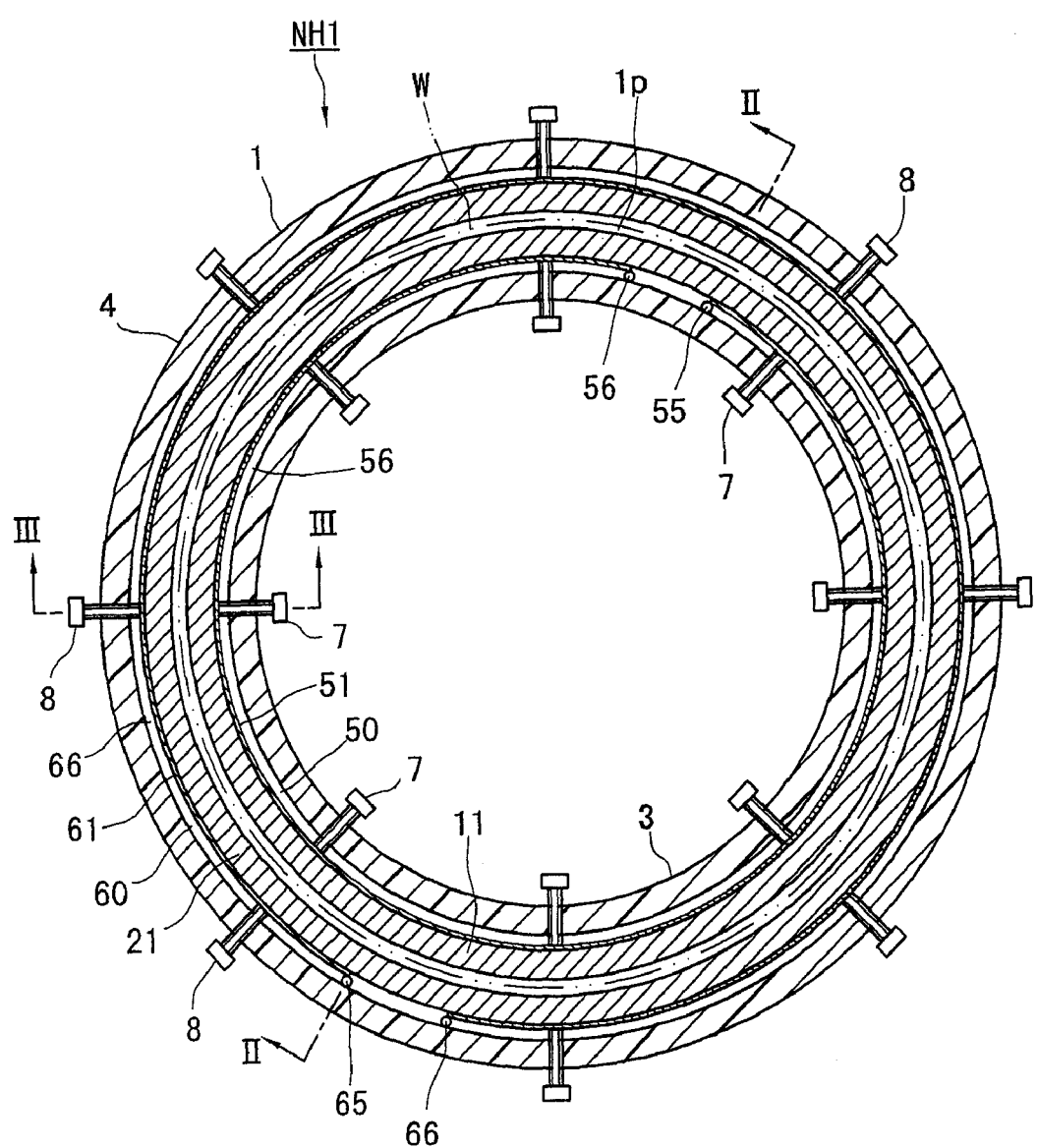
FIG. 1 is a plan sectional view of a nozzle head of a normal pressure plasma etching apparatus according to a first embodiment of the present invention.
Figure 2:
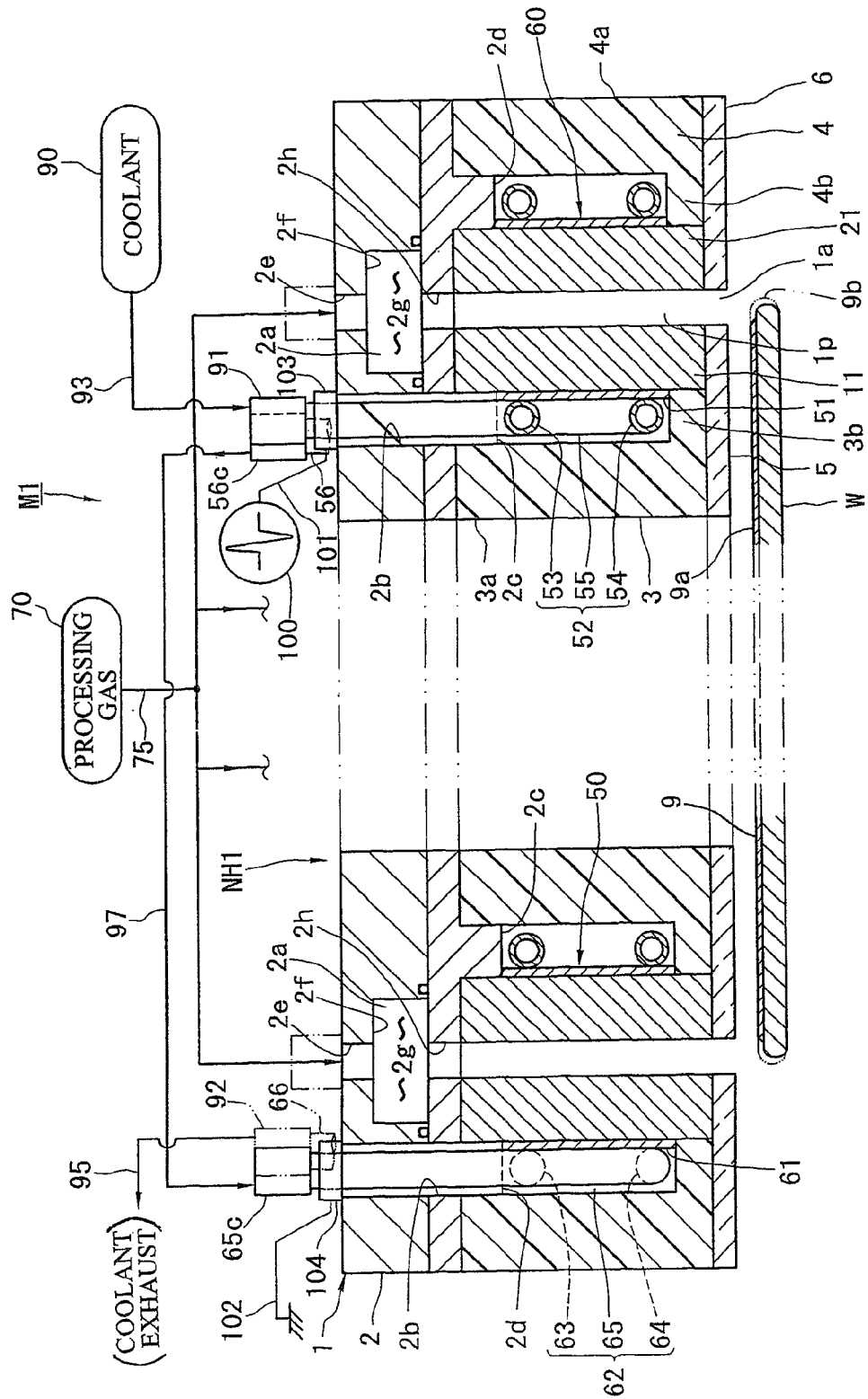
FIG. 2 is a schematic construction diagram of the normal pressure plasma etching apparatus including a vertical sectional view of the nozzle head taken on line II-II of FIG. 1.

The first embodiment will be described. FIGS. 1 and 2 show a normal pressure plasma etching apparatus M1 (plasma processing apparatus) in which a semiconductor wafer W is used as an object to be processed. The wafer W will be described first. As shown in FIGS. 1 and 2, the wafer W is formed in a disc-like configuration by semiconductor such as silicon. On an upper surface or outer surface of the wafer W, a film 9 such as a photoresist is formed, for example, by spin coater. This film 9 covers the entirety of the upper surface of the wafer W and extends up to the outer edge, i.e., the outer edge part of the upper surface and the outer end face. Should this film 9b occupying the outer edge (imaginary line of FIG. 2) be allowed to remain, it could be an interference in the succeeding polishing process or it could be a cause for generating particles in the process for holding the outer edge. Thus, the wafer W is sent to the normal pressure plasma etching apparatus M1 after it is subjected to the film forming process, and then, the wafer W is subjected to an etching process for removing the film 9b occupying the outer edge.

The normal pressure plasma etching apparatus M1 will now be described.

Figure 4:
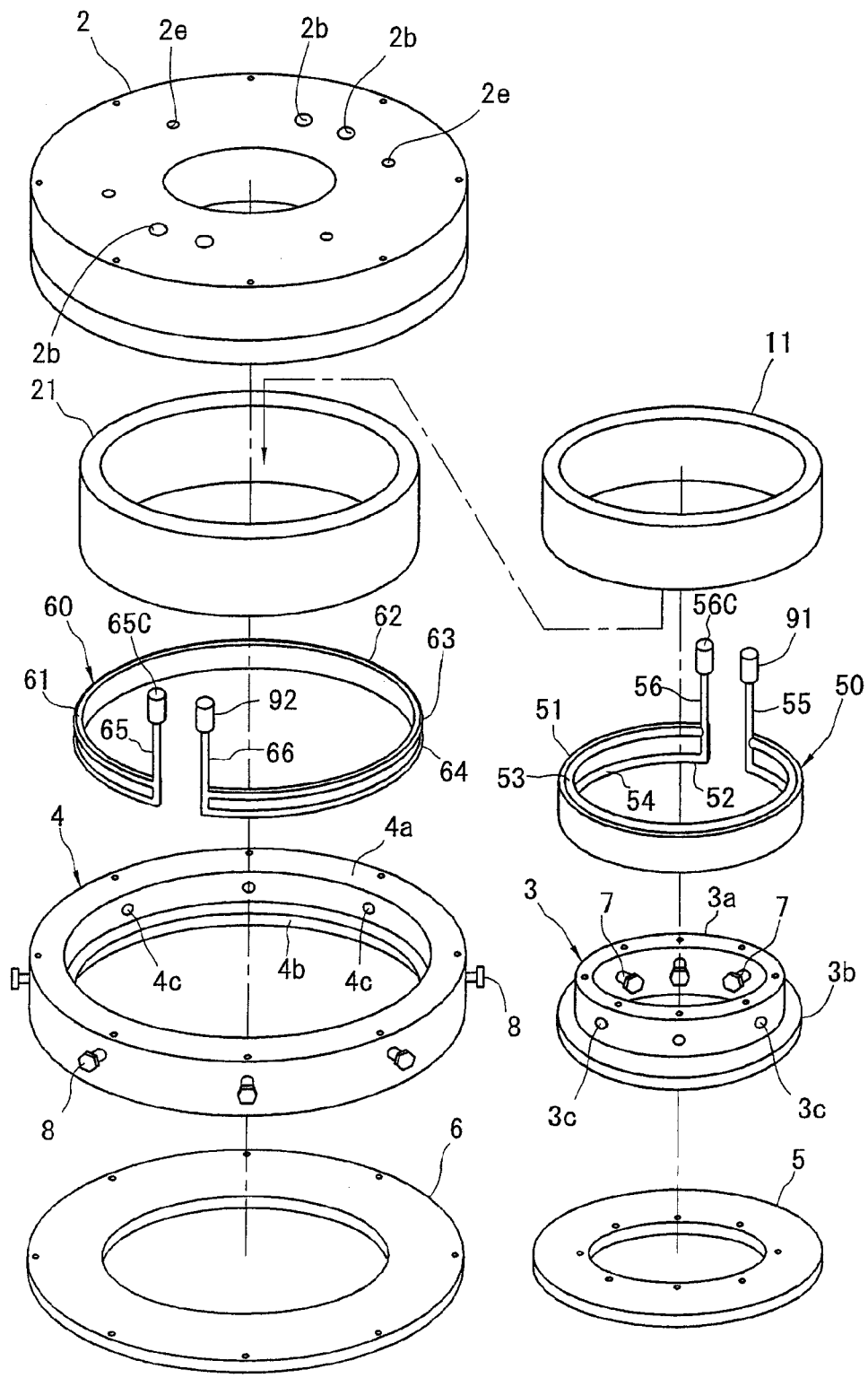
FIG. 4 is an exploded perspective view of the nozzle head.

As shown in FIGS. 1 and 2, the normal pressure plasma etching apparatus M1 comprises an annular nozzle head NH1 in a plan view, a processing gas supply 70, and a pulse powder supply 100 (electric field imparting means). As shown in FIGS. 1 and 4, the nozzle head NH1 comprises an inner holder 3, an inner cooling member 50 (inner temperature adjusting member), an inner electrode 11, an outer electrode 21, an outer cooling member 60 (outer temperature adjusting member), and an outer holder 4. Those component members 3, 50, 11, 21, 60, 4 have annular configurations which are different in size, and they are concentrically circularly superimposed in this order from the inner side, thereby forming a multi-annular configuration. As shown in FIG. 2, an upper lid 2 is put on the upper side of those component members 3, 50, 11, 21, 60, 4, an inner bottom plate 5 is applied to the lower side of the component members 3, 50, 11, and an outer bottom plate 6 is applied to the lower side of the component members 21, 60, 4.

The nozzle head NH1 will be described in more detail.

As shown in FIGS. 1 through 4, the nozzle head NH1 includes a head main body 1 supported by a base or apparatus main body, not shown, the inner and outer electrodes 11, 21 and the inner and outer cooling members 50, 60 which are all received in the head main body 1.

The inner electrode 11 has an annular configuration with a vertically elongate cross section. Although not shown in detail, a solid dielectric is thermally sprayed on to the whole surface including the outer peripheral surface of the inner electrode 11 to form a film thereon.

The outer electrode 21 has an annular configuration with a vertically elongate cross section as in the case with the inner electrode 11 but having a larger diameter than the inner electrode 11 and surrounds the inner electrode 11. Although not shown in detail, a solid dielectric is thermally sprayed on to the entire surface including the inner peripheral surface of the outer electrode 21 to form a film thereon. The inside diameter of the outer electrode 21 is larger than the outside diameter of the inner electrode 11.

Owing to this arrangement, an annular plasmatizing space $1p$ is formed between the inner and outer electrodes 11, 21. This plasmatizing space $1p$ is connected to a processing gas supply 70 through a gas inlet passage $2a$, as later described, of the upper lid 2 and a processing gas supply tube 75 connected to the gas introduction passage $2a$. $CF_4$, for example, is reserved in the processing gas supply 70 as an etching gas.

The inner electrode 11 is connected to a pulse power supply 100 (electric field imparting means) through an inner cooling part 50 and a feeder line 101. The pulse power supply 100 outputs a pulse shape voltage. It is desirous that the rising time and/or falling time of this pulse is 10 micro seconds or less, the electric field intensity is 10 to 1000 kV/cm and the frequency is 0.5 kHz or more between the electrodes 11, 12. Instead of the pulse wave, a continuous wave power supply such as a high frequency wave may be used.

The outer electrode 21 is grounded to the earth through an outer cooling member 60 and a grounding line 102. Owing to this arrangement, the inner electrode 11 serves as an electric field imparting electrode (hot electrode) and the outer electrode 21 serves as a grounding electrode (earth electrode). It is also accepted that the outer electrode 21 serves as an electric field imparting electrode and the inner electrode 11 serves as a grounding electrode.

The inner and outer electrodes 11, 21 are centered such that they are mutually concentrically arranged and their centers are aligned with the center axis of the nozzle head NH1. This centering structure will be described in detail later.

The head main body 1 includes the upper lid 2, the inner holder 3, the outer holder 4, the inner bottom plate 5 and the outer bottom plate 6.

The upper lid 2 is constituted by laminating a plurality (only two are shown in FIG. 2) of disc-like plates each having a center hole. Although not shown, this upper lid 2 is fixed to a base or apparatus main body, not shown. Processing introduction passages $21a$ and insertion holes $2b$ for allowing end tube parts 55, 56, 65, 66, as later described, to pass therethrough, are formed in the upper lid 2.

The introduction passage $2a$ of the upper lid 2 introduces the processing gas coming from the supply tube 75 into the plasmatizing space $1p$ after the processing gas is uniformed along the peripheral direction of the plasmatizing space $1p$. That is, as shown in FIG. 2, a plurality (only four are shown in FIG. 4) of holes $2e$ serving as upper end openings of the introduction passage 2a are arranged, side by side, at predetermined intervals in the peripheral direction of the upper lid 2, for example, in the uppermost component plate of the upper plate 2. The processing gas supply tube 75 is branched at an intermediate part thereof corresponding to the number of the holes 2e and connected to the corresponding holes 2e. An annular recess 2f having a comparatively large cross section is formed at a lower surface of the upper-side component plate of the upper lid 2. An annular chamber 2g (an intermediate part of the introduction passage 2a) is defined by this annular recess 2f and its lower-side component plate. A plurality of holes 2h serving as downstream end openings of the introduction passage 2a are arranged, side by side, at small intervals in the peripheral direction in the lowermost component plate. Those holes 2h are connected to the plasmatizing space 1p.

Figure 3:
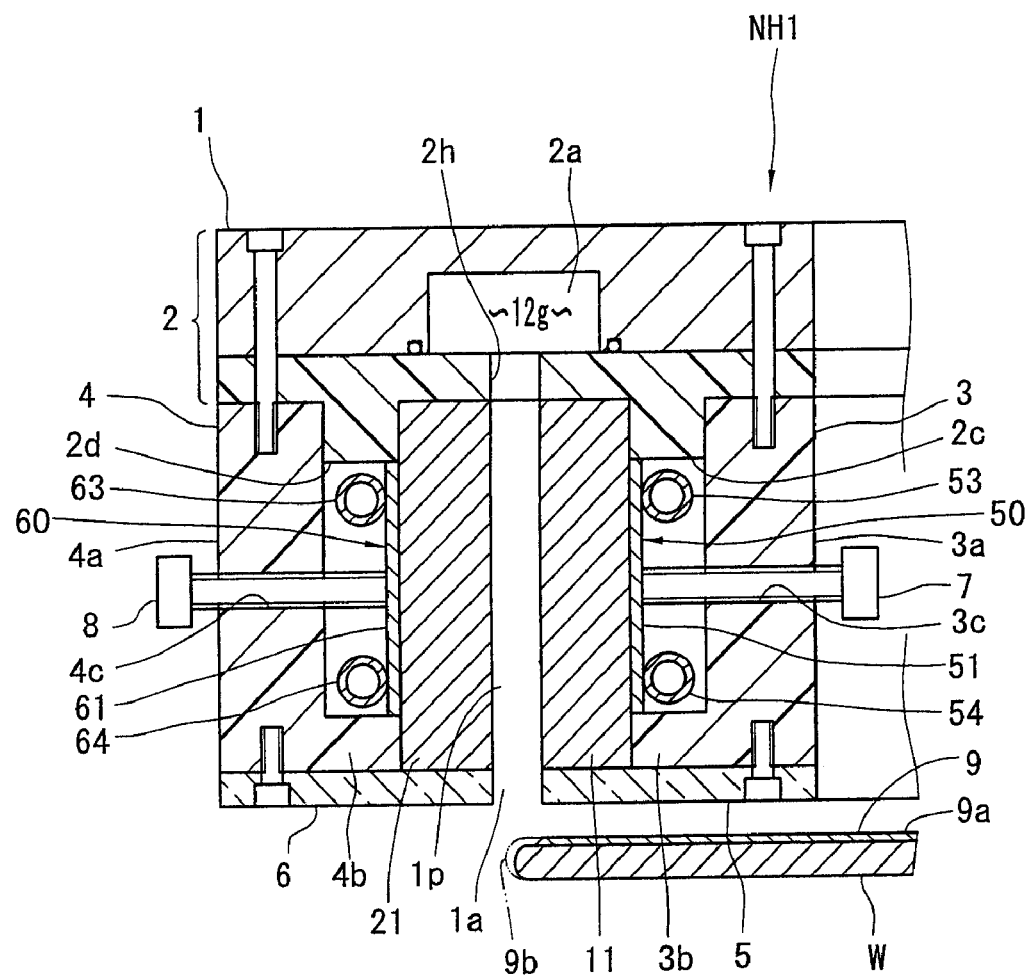
FIG. 3 is a vertical sectional view of the nozzle head taken on line III-III of FIG. 1.

As shown in FIGS. 2 and 3, the upper lid 2 is put on the electrodes 11 and 21. Two inner and outer annular projections 2c, 2d, that are concentrically disposed, are formed on a lower surface of the lowermost component plate of the upper lid 2. Upper end parts of the electrodes 11, 21 are sandwiched between the annular projections 2c, 2d. The outside diameter of the inner annular projection 2c is slightly smaller than the inside diameter of the inner electrode 11, so that a clearance is set between the outer peripheral surface of the annular projection 2c and the inner peripheral surface of the inner electrode 11. The inside diameter of the outer annular projection 2d is slightly larger than the outside diameter of the outer electrode 21, so that a clearance is set between the inner peripheral surface of the annular projection 2d and the outer peripheral surface of the inner electrode 11.

As shown in FIGS. 1 and 4, the inner holder 3 includes an annular holder main body 3a which is made of insulating resin and having a vertically elongate cross section, and a flange 3b disposed at the outer periphery of a lower end part of this holder main body 3a. As shown in FIG. 2, an upper surface of the holder main body 3a is abutted with a part offset to the inner periphery of a lower surface of the upper lid 2 and an upper part of the outer peripheral surface of the holder main body 3a is abutted with an inner peripheral surface of an annular projection 2c. In that condition, the holder main body 3a is fixedly bolted to the upper lid 2 (FIG. 3). The inside diameter of the flange 3b of the inner holder 3 is slightly smaller than the inside diameter of the inner electrode 11, and a clearance is set between an end face of the flange 3b and the inner peripheral surface of the inner electrode 11.

As shown in FIGS. 1 and 4, the outer holder 4 includes an annular holder main body 4a which is made of insulating resin and having a larger diameter than the inner holder 3 and a vertically elongate cross section, and a flange 4b disposed at the inner periphery of a lower end part of this holder main body 4a. As shown in FIG. 2, an upper surface of the holder main body 4a is abutted with a part offset to the outer periphery of a lower surface of the upper lid 2 and an upper part of the inner peripheral surface of the holder main body 4a is abutted with an outer peripheral surface of an annular projection 2d. In that condition, the holder main body 4a is fixedly bolted to the upper lid 2 (FIG. 3). Thus, the outer holder 4 connected to the inner holder 3 through the upper lid 2 and concentrically fixed in position with respect to the inner holder 3. The inside diameter of the flange 4b of the outer holder 4 is slightly larger than the outside diameter of the outer electrode 21, and a clearance is set between an end face of the flange 4b and the outer peripheral surface of the outer electrode 21.

As shown in FIG. 4, the inner bottom plate 5 is composed of a transparent dielectric (insulating resin) and has a disc-like configuration which includes a center hole. As shown in FIG. 2, the inner holder 3 is applied to the lower surface of the inner holder 3 and fixedly bolted to the holder main body 3a (FIG. 3). The inner bottom plate 5 is projected radially outwardly from the flange 3b of the inner holder 3 and the inner electrode 11 is placed on this projected part of the inner bottom plate 5. The outer end face of the inner bottom plate 5 is generally flush with the outer peripheral surface of the inner electrode 11. The inner bottom plate 5 has such a role as to serve as a solid dielectric of the inner electrode 11.

As shown in FIG. 4, the outer bottom plate 6 is composed of a dielectric (insulating resin) and has a disc-like configuration which includes a center hole larger in diameter than that of the inner bottom plate 5. As shown in FIG. 2, the outer bottom plate 6 is applied to the lower surface of the outer holder 4 and fixedly bolted to the holder main body 4a (FIG. 3). The outer bottom plate 6 is projected radially inwardly from the flange 4b of the outer holder 4, and the outer electrode 21 is placed on the upper surface of this projected part of the outer bottom plate 6. The inner end face of the outer bottom plate 6 is generally flush with the inner peripheral surface of the outer electrode 21. The outer bottom plate 6 also has such a role as to serve as a solid dielectric of the outer electrode 21. The inside diameter of the outer bottom plate 6 is larger than the outside diameter of the inner bottom plate 5, and an annular blow-off hole (blow-off port) 1a is formed between the inner peripheral surface of the outer bottom plate 6 and the outer peripheral surface of the inner bottom plate 5. This blow-off hole 1a is connected straightly to the annular plasmatizing space 1p between the electrodes 11, 21.

Next, the electrode cooling structure (electrode temperature adjusting structure) will be described.

As shown in FIG. 4, an inner cooling member 50 as a cooling means for the inner electrode 11 includes an inner heat transfer plate 51 composed of a C-shaped metal plate in a plan view, and a metal-made inner coolant tube 52 (inner coolant passage) disposed at the inner peripheral surface of this plate 51. The inner cooling member 50 has a C-shaped configuration as a whole. The inner coolant tube 52 includes two peripheral tube parts 53, 54 which form a vertical pair, one at an upper position and the other at a lower position, and which extend along the peripheral direction of the inner heat transfer plate 51, and a pair of end tube parts 55, 56 vertically extending in such a manner as to connect the end parts of the upper and lower peripheral tube parts 53, 54 to each other at the opposite end parts of the inner heat transfer plate 51.

As shown in FIGS. 2 and 3, the inner cooling member 50 is placed on the flange 3b of the inner holder 3 and sandwiched between the holder main body 3a and the inner electrode 11 with the annular projection 2c of the upper lid 2 restraining the inner cooling member 50 from the above. The outer peripheral surface of the inner heat transfer plate 51 is disposed along the inner peripheral surface of the inner electrode 11.

The C-shaped metal-made inner heat transfer plate 51 and the peripheral tube parts 53, 54 have elasticity and are slightly expansible/contractible. In a natural condition, the outside diameter of the heat transfer plate 51 is generally equal to the inside diameter of the inner electrode 11. Owing to this arrangement, the inner cooling member 50 can be expanded/contracted between a first position where the member 50 is expanded so as to be pressed with the inner peripheral surface of the inner electrode 11 and a second position where the member 50 is contracted so as to be slightly radially inwardly separated away the inner peripheral surface of the inner electrode 11.

As shown in FIG. 4, the outer cooling member 60 as a cooling means for the outer electrode 11 includes an outer heat transfer plate 61 composed of a C-shaped metal sheet in a pan view, and a metal-made outer coolant tube 62 (outer medium passage) disposed at the outer peripheral surface of this plate 61. The outer cooling member 60 has a generally C-shaped configuration in a sectional view, as a whole, whose diameter is larger than that of the inner cooling member 50. The outer coolant tube 62 includes two peripheral tube parts 63, 64 which form a vertical pair, one at an upper position and the other at a lower position, and which extend along the peripheral direction of the outer heat transfer plate 61, and a pair of end tube parts 65, 66 vertically extending in such a manner as to connect the upper and lower peripheral tube parts 63, 64 to each other at the opposite end parts of the outer heat transfer plate 61.

As shown in FIGS. 2 and 3, the outer cooling member 60 is placed on the flange 4b of the outer holder 4 and sandwiched between the holder main body 4a and the outer electrode 21 with the annular projection 2d of the upper lid 2 restraining the outer cooling member 60 from the above. The inner peripheral surface of the outer heat transfer plate 61 is disposed along the inner peripheral surface of the outer electrode 11.

The C-shaped metal-made outer heat transfer plate 61 and the peripheral tube parts 63, 64 have elasticity and are slightly expansible/contractible. In a natural condition, the inside diameter of the heat transfer plate 61 is generally equal to the outside diameter of the outer electrode 21. Owing to this arrangement, the outer cooing member 60 can be expanded/contracted between a first position where the member 60 is contracted so as to be pressed with the outer peripheral surface of the outer electrode 21 and a second position where the member 60 is expanded so as to be slightly radially outwardly separated away the outer peripheral surface of the outer electrode 21.

As shown in FIG. 2, the end tube parts 55, 56, 65, 66 of the inner and outer cooling members 50, 60 are respectively passed through the insertion holes 2b formed on the upper lid 2 and projected upward from the upper lid 2. Tube joints 91, 56C, 65C, 92 are attached to the upper end parts of the tube parts 55, 56, 65, 66, respectively. A coolant supply tube 93 is extended from a coolant supply 90 and connected to the tube joint 91 of the end tube part 55 of the inner coolant 52. The tube joint 56C of the end tube part 56 of the inner coolant tube 52 and the tube joint 65C of the end tube part 65 of the outer coolant tube 62 are connected to each other through a connecting tube 97. A coolant exhaust tube 95 is extended from the tube joint 92 of the end tube part 66 and the outer coolant tube 62. A water supply pump for supplying, for example, water as a coolant (temperature adjusting medium) is used as the coolant supply 90.

Of course, it is accepted that the coolant supply tube 93 is connected to the tube joint 56C of the inner coolant tube 52, and the connecting tube 97 is connected to the tube joint 91. It is also accepted that the connecting tube 97 is connected to the tube joint 92 of the outer coolant tube 62 and the coolant exhaust tube 95 is connected to the tube joint 65C. It is also accepted that the coolant supply tube 93 is connected to selected one of the tube joints 65C, 92 of the outer coolant tube 62, the coolant exhaust tube 95 is connected to selected one of the joints 91, 56C of the inner coolant tube 52, and the remaining tube joints are connected to each other through the connecting tube 97. Instead of connecting the inner and outer coolant tubes 52, 62 in series through the connecting tube 97, coolants may be flowed, in parallel, to the respective coolant tubes 52, 62.

The cooling members 50, 60 are also commonly used as a part of a mechanism for supplying power to the electrodes 11, 21 and for grounding the electrodes 11, 21. That is, a power supply connector 103 is attached to the projected part of the conductive inner coolant tube 52 which projected part is projected from the upper lid 2. A feeder 101 extending from the pulse power supply 100 is connected to this power supply connector 103. A grounding connector 104 is attached to the projected part of the end tube part 65 of the conductive outer coolant tube 62 which projected part is projected from the upper lid 2. The grounding line 102 is connected to this grounding connector 104.

The electrode centering structure will be described. The cooling members 50, 60 are also related to the centering of the electrodes.

That is, bolt holes 3c are formed in the holder main body 3a of the inner holder 3 at predetermined intervals in the peripheral direction. The bolts holes 3c are passed through the holder main body 3a in the thickness direction or radial direction. Push bolts 7 (inner pushers) are screwed into the corresponding bolt holes 3c from the inner periphery side of the holder 3. The push bolts 7 are composed of insulating resin. The tip of each push bolt 7 is passed between the upper and lower peripheral tube parts 52, 53 and abutted against the heat transfer plate 51 to press the heat transfer plate 51 against the inner electrode 11 in the diameter-enlarging direction. Thus, the push bolts push the inner electrode 11 radially outwardly through the heat transfer plate 51. By pushing force of the pushing bolts 7 which are spacedly arranged in the peripheral direction, the inner electrode 11 is supported by the head main body 1 in a stable manner. By mutually adjusting the screwing amounts of the push bolts 7, the centering of the inner electrode 11 is carried out.

Bolt holes 4c are formed in the holder main body 4a of the outer holder 4 at predetermined intervals in the peripheral direction. The bolt holes 4c are passed through the holder main body 4a in the thickness direction or radial direction. Push bolts 8 (outer pushers) are screwed into the corresponding bolt holes 4c from the outer periphery side of the holder 4. The push bolts 8 are composed of insulating resin. The tip of each push bolt 8 is passed between the upper and lower peripheral tube parts 63, 64 of the outer cooling member 60 and abutted with the heat transfer plate 61 to press the heat transfer plate 61 against the outer electrode 21 in the diameter-enlarging direction. Thus, the push bolts 8 push the outer electrode 21 radially inwardly through the heat transfer plate 61. By pushing force of the push bolts 8 spacedly arranged in the peripheral direction, the outer electrode 21 is supported by the head main body 1 in a stable manner. By mutually adjusting the screwing amounts of the push bolts 8, the centering of the outer electrode 21 is carried out.

Operation of the normal pressure plasma etching apparatus M1 thus constructed will be described.

A wafer W as an object to be processed is set to a lower part of the nozzle head NH1. At that time, the center axis of the nozzle head NH1 is aligned with the center of the wafer W. By doing so, the outer edge of the wafer W is positioned immediately under the annular blow-off port 1a.

Next, the processing gas coming from the processing gas supply 70 is uniformly introduced over the entire periphery of the annular plasmatizing space 1p through the supply tube 75 and the introduction passage 2a.

In parallel with this processing, a pulse voltage is outputted from the pulse power supply 100. This pulse voltage is imparted to the inner electrode 11 through the power supply line and the inner cooling member 50. Since, the inner cooling member 50 is not merely contacted with the inner electrode 11 but the member 50 is pressed against the inner electrode 11 by the push bolts 7 (inner pushers), a favorable conductive condition can be obtained. This makes it possible to reliably impart the pulse voltage to the inner electrode 11. Similarly, the outer electrode 21 and the outer cooling member 60 can be brought into a favorable conductive condition by means of pushing of the push bolts 8. This makes it possible to reliably ground the outer electrode 21 to the earth. Thus, a pulse electric field is formed in the annular plasmatizing space 1p between the inner and outer electrodes 11, 21, and the processing gas in the plasmatizing space 1p can be plasmatized by this electric field. The processing gas thus plasmatized is blown off from the entire periphery of the annular blow-off port 1a. and sprayed to the entire periphery of the outer edge of the wafer W. By doing so, the film 9b formed on the outer edge of the wafer W can be etched at a time over the entire periphery. Therefore, the time require for etching process can be reduced extensively.

The coolant coming from the coolant supply 70 is sent to the supply tube 93. This coolant is introduced into the end tube part 55 of the inner cooling member 50 via the supply tube 93. The coolant is then branched into the upper and lower peripheral tube parts 53, 54 and flowed in the peripheral direction. In the flowing process in the peripheral tube parts 53, 54, the inner heat transfer plate 51 and thus, the inner electrode 11 can be cooled (temperature adjustment). The inner heat transfer plate 51 has a large heat transferring area and in addition, the entire heat transferring surface (outer peripheral surface) can be pressed against the inner electrode 11 by the push bolts 7 instead of being merely contacted with the inner electrode 11. This makes it possible to obtain a favorable heat transferring condition. Moreover, the coolant can be circulated generally in one cycle through the peripheral tube parts 53, 54. Moreover, the coolant can be circulated generally in one cycle through each of the upper and lower two peripheral tube parts 53, 54. By this, the generally entire heat transfer plate 51 can reliably be cooled, and thus, the generally entire inner electrode 11 can reliably be cooled.

Thereafter the coolant is converged in the end tube part 56 and sent to the end tube part 65 of the outer cooling member 60 via the connecting tube 97. The coolant is then branched into the upper and lower peripheral tube parts 63, 64 and flowed in the peripheral direction. In the flowing process in the peripheral tube parts 63, 64, the outer heat transfer plate 61 and thus the outer electrode 21 can be cooled (temperature adjustment). The outer heat transfer plate 61 has a large heat transferring area and in addition, the entire heat transferring surface (inner peripheral surface) can be pressed against the outer electrode 21 by the push bolts 8 instead of being merely contacted with the outer electrode 21. This makes it possible to obtain a favorable heat transferring condition. Moreover, the coolant can be circulated generally in one cycle through the peripheral tube parts 63, 64. Moreover, the coolant can be circulated generally in one cycle through each of the upper and lower two peripheral tube parts 63, 64. By this, the generally entire heat transfer plate 61 can reliably be cooled, and thus, the generally entire outer electrode 21 can reliably be cooled. Thereafter, the coolant is converged at the end tube part 66 and exhausted through the exhaust tube 95.

As discussed, according to the normal pressure plasma etching apparatus M1, the annular electrodes 11, 21 can reliably be cooled by the cooling members 50, 60. Moreover, since it is not required to form a cooling passage in the annular electrodes 11, 21 themselves, easy manufacturing can be obtained.

According to the normal pressure plasma etching apparatus M1, by untightening the push bolts 7 and retreating the bolts 7 toward the inner holder 3, the inner electrode 11 and the inner cooling member 50 can be disassembled/assembled with ease. Similarly, by untightening the push bolts 8 and retreating the bolts 8 toward the outer holder 4, the outer electrode 21 and the outer cooling member 60 can be disassembled/assembled with ease. Thus, the maintenance operation of the inner and outer electrodes 11, 21 can be carried out with ease. Moreover, by expanding/contracting the C-shaped cooling members 50, 60, the disassembling/assembling operation can be carried out more easily.

Moreover, at the time of assembling operation, the centering of the inner electrode 11 can be carried out by adjusting the screwing amounts of the inner push bolts 7. Similarly, by adjusting the screwing amounts of the outer push bolts 8, the centering of the outer electrode 21 can be carried out. That is, the inner and outer electrodes 11, 21 can be correctly positioned such that the inner and outer electrodes 11, 21 are concentrically arranged, and the centers of the electrodes 11, 21 are aligned with the center axis of the nozzle head NH1. By doing so, the plasmatizing space 1p can be uniformed in width over the entire periphery, and thus, the blow-off plasma through the blow-off port 1a can be uniformed over the entire periphery. As a result, the etching of the outer edge of the wafer S can reliably be uniformed over the entire periphery.

The electrodes and the holders thereof are not limited to a annular configuration of a genuine circle but they may take an annular configuration such a non-genuine circle including an oval and a straight line. In match therewith, the C-shaped configuration of the temperature adjusting member may be a partly cut-out non-genuine circular configuration.

In the first embodiment, the outer holder may be fixed in position with respect the inner holder such that the outer holder is eccentric with the inner holder, or the inner and outer electrodes may be eccentric with each other at their regular positions.

The inner and outer holders may be formed into an integral body.

The temperature adjusting member is not limited to one for cooling the electrodes but it may be one for heating the electrodes. Also, the temperature adjusting member may be one for cooling the electrodes sometime and for heating them some other time. As the coolant, a hot water may be used instead of the normally hot water and the cold water.

Only one peripheral tube part may be provided to each heat transfer plate, or three or more peripheral tube parts may be provided to each heat transfer plate in such a manner as to be arranged, side by side, in the width direction of the heat transfer plate. The peripheral tube part may be extended in the peripheral direction of the heat transfer plate, while extending in a zigzag manner like a wave-form.

It is accepted that the outside diameter of the inner temperature adjusting member is larger than the inside diameter of the inner electrode in the natural condition and the inner temperature adjusting member is abutted with the inner peripheral surface of the inner electrode by its own elastic force. Similarly, it is accepted that the inside diameter of the outer temperature adjusting member is smaller than the outside diameter of the outer electrode in the natural condition and the outer temperature adjusting member is abutted with the outer peripheral surface of the outer electrode by its own elastic force.

Next, other embodiments will be described. In the embodiments to be described hereinafter, like reference numeral is denoted, where appropriate, to like component as in the above-mentioned embodiment and description thereof is simplified.

Second Embodiment

Figure 5:
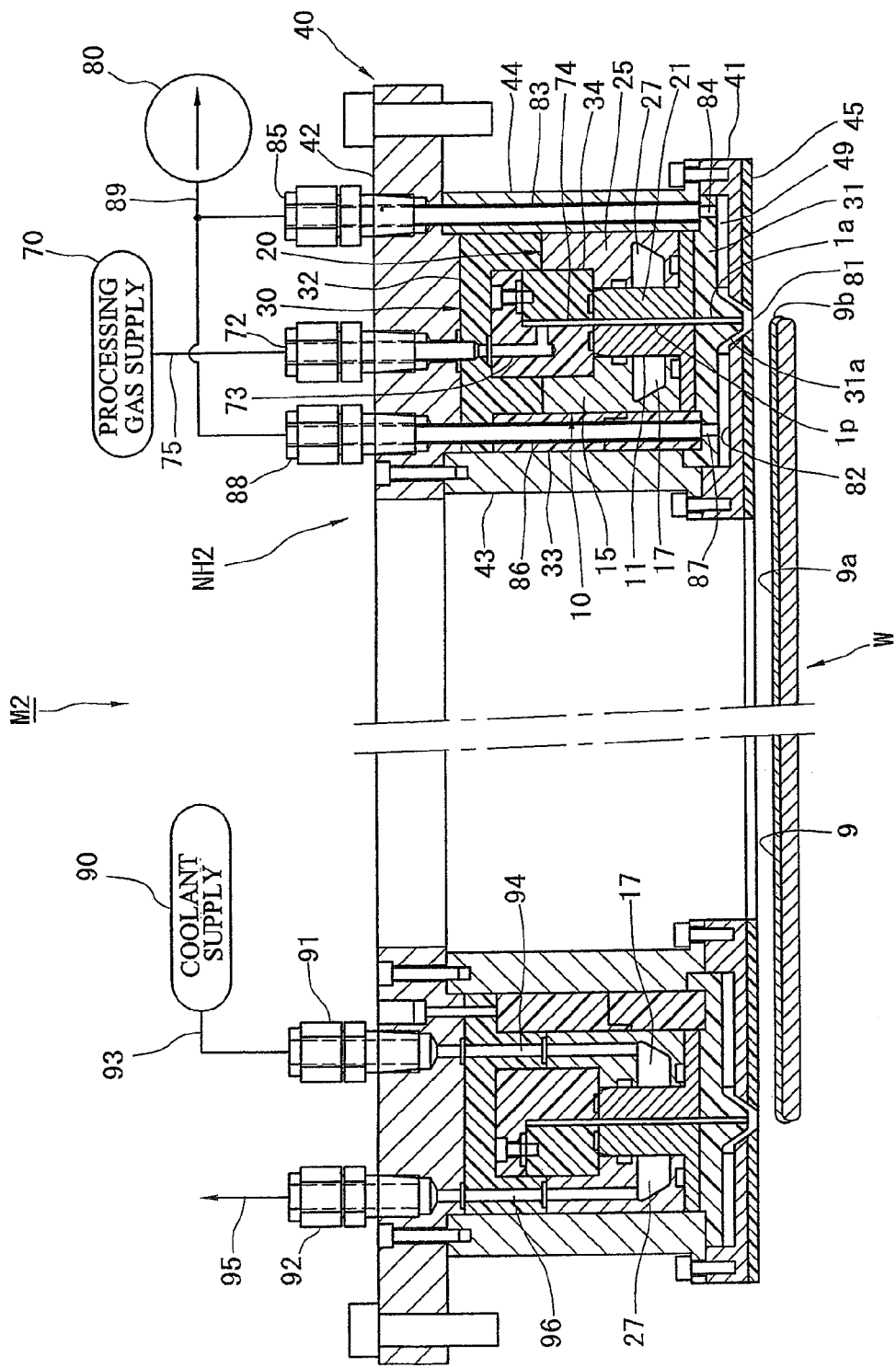
FIG. 5 is a vertical sectional view of a nozzle head of a normal pressure plasma etching apparatus according to a second embodiment of the present invention.
Figure 6:
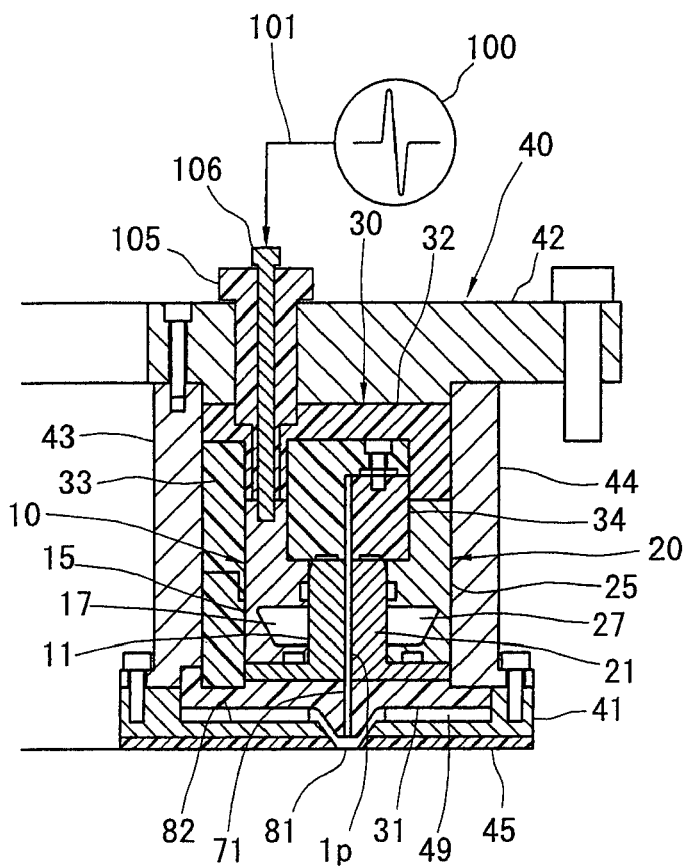
FIG. 6 is a view in which the nozzle head according to the second embodiment is vertically sectioned at a position different from FIG. 5.

As shown in FIGS. 5 and 6, in the second embodiment, plasma etching of a film 9b formed on the outer edge of a semiconductor wafer W is carried out by a normal pressure plasma etching apparatus. The normal pressure plasma etching apparatus M2 comprises an annular nozzle head NH2 in a plan view, a pulse power supply 100 (electric field imparting means), a processing gas supply 70, a suction pump 80 (suction device), and a coolant supply 90 (temperature adjusting medium supply). The nozzle head NH2 comprises an inner electrode structure 10, an outer electrode structure 20, an insulating holder 30 for covering those electrode structures 10, 20, and a metal-made (conductive) frame 40 for covering this holder 30. Those component elements 10, 20, 30, 40 each have an annular configuration.

Figure 7:
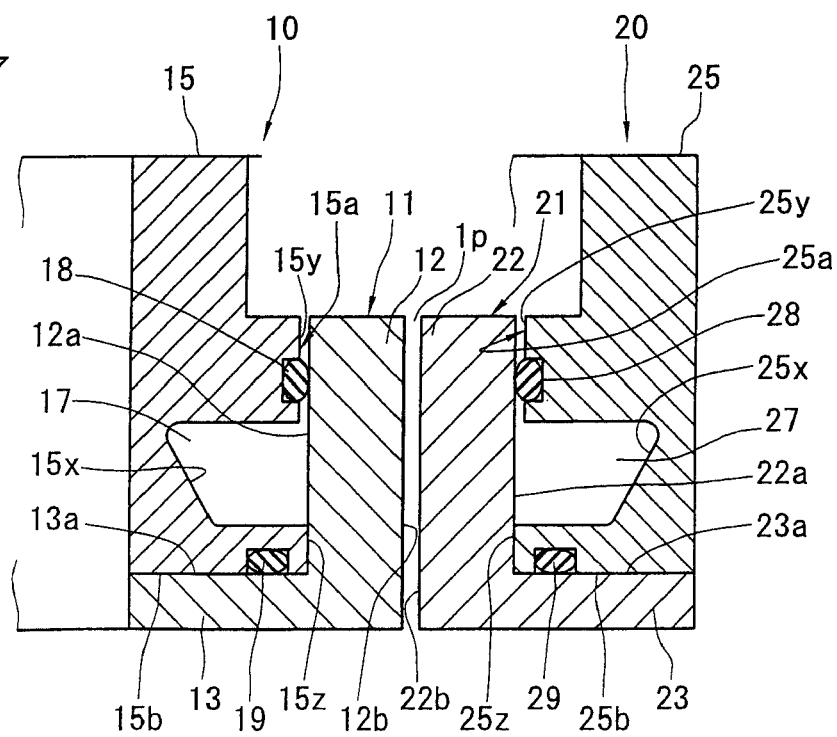
FIG. 7 is an enlarged vertical sectional view showing the structure of inner and outer electrodes incorporated in the nozzle head of the second embodiment.

As best shown in FIG. 7, the inner electrode structure 10 comprises an annular electrode 11 (inner electrode), and an annular metal-made passage forming member 15 concentrically arranged radially inwardly of this electrode 11. The electrode 11 includes a cylindrical part 12, and an annular flat plate-like flange part 13 expanded radially outwardly from the lower end of the cylindrical part 12. The electrode 11 has an L-shaped configuration in section. The inner peripheral surface 12a of the cylindrical part 12 and the upper flat surface 13a of the flange 13 are orthogonal to each other and each provided as a confronting surface confronting a passage forming member 15 as later described.

The outer peripheral surface 15a of the passage forming member 15 includes an annular groove 15x at its intermediate part, and it also includes a cylindrical first peripheral surface part 15y and a cylindrical second peripheral surface 15z which are arranged with the annular groove 15x sandwiched therebetween. The lower surface of the passage forming member 15 is defined as a flat surface 15b orthogonal to the second peripheral surface 15z. The outer peripheral surface 15a and the flat surface 15b are provided as confronting surfaces, as later described, which are confronted with the electrode 11.

The passage forming member 15 is fitted to the radially inner side of the electrode 11 with its outer peripheral surface 15a confronted with the inner peripheral surface 12a of the electrode 11 and with its flat surface 15b confronted with the flat surface 13a. A medium passage 17 is defined by the inner peripheral surface 12a of the inner electrode 11 and the annular groove 15x which is a part of the outer peripheral surface 15a of the passage forming member 15. An annular receiving groove is formed in the first peripheral surface 15y and in the flat surface 15b. O-rings 18, 19 (seal member) are received in those receiving grooves, respectively. By bringing those O-rings 18, 19 into contact respectively with the inner peripheral surface 12a and the flat surface 13a of the inner electrode 11 in their elastically deformed conditions, the upper and lower parts of the medium passage 17 are sealed. The flat surface 13a of the electrode 11 and the flat surface 15b of the passage forming member 15 are contacted with each other when the electrode structure 10 is received in the holder 30, as later described.

As mentioned above, the lower O-ring 19 (second seal member) of the annular groove 15x is not attached to the outer peripheral surface 15a and only the upper O-ring 18 (first seal member) is disposed at the outer peripheral surface 15a. Owing to this arrangement, when the passage forming member 15 is fitted to the electrode 11, easy insertion can be obtained because the insertion resistance is small.

The first peripheral surface part 15y of the passage forming member 15 is slightly smaller than the inner peripheral surface 12a of the electrode 11, and therefore, a clearance enough for inserting the O-ring 18 is formed therebetween. The second peripheral surface part 15z is slightly larger in diameter than the first peripheral surface part 15y and substantially equal t the inner peripheral surface 12a of the electrode 11. Strictly, there is a fine clearance between the first peripheral surface part 15y and the inner peripheral surface 12a of the electrode 11 so that the passage forming member 15 can be inserted in the cylindrical part 12 of the electrode 11. However, since this clearance is substantially zero, the first peripheral part 15y and the inner peripheral surface 12a of the electrode 11 are generally contacted with each other. As a result, the centering and positioning of the electrode 11 can be carried out correctly.

The outer electrode structure 20 is larger in diameter than the inner electrode structure 10 and concentrically disposed at the radially outer side of the inner electrode structure 10. The outer electrode structure 20 comprises an annular electrode 21 (outer electrode), and an annular metal-made passage forming member 25 concentrically disposed at the radially outer side of the electrode 21. Since those electrode 21 and passage forming member 25 are laterally symmetrical with the inner electrode structure 10 in a cross section, the member 25 will be described briefly in order to avoid the duplicate description.

The electrode 21 includes a cylindrical part 22 and an annular flange part 23 extending radially outwardly from the lower end of the cylindrical part 22. The outer peripheral surface 22a of the cylindrical part 22 and the upper flat surface 23a of the flange part 23 are provided as confronting surfaces. The inner peripheral surface 25a (confronting surface), that is a cylindrical surface, of the passage forming member 25 includes an annular groove 25x, a first peripheral surface 25y and a second peripheral surface 25z. The lower surface of the passage forming member 25 is defined as a flat surface 25b (confronting surface) which is orthogonal to the second peripheral surface part 25x.

A medium passage 27 is defined by the outer peripheral surface 22a of the electrode 21 and the annular groove 25x of the passage forming member 25. The O-ring 28 (first seal member) received in the receiving groove of the first peripheral surface part 25y is contacted with the inner peripheral surface 22a of the electrode 21 and the O-ring 29 (second seal member) is contacted with the flat surface 23a of the electrode 21, thereby sealing the upper and lower parts of the medium passage 27.

As in the case with the inner electrode structure 10, a clearance enough for inserting the O-ring 28 therethrough is formed between the first peripheral surface part 25y of the passage forming member 25 and the outer peripheral surface 22a of the electrode 11, and the clearance formed between the second peripheral surface part 25z and the outer peripheral surface 22a is substantially zero.

The inside diameter of the electrode 21 of the outer electrode structure 20 is larger than the outside diameter of the electrode 11 of the inner electrode structure 10, and an annular gap 1p is formed between the inner peripheral surface 22b of the electrode 21 and the outer peripheral surface 12b of the electrode 11. This gas 1p serves as a gas passage for the processing gas. A solid dielectric is thermally sprayed on to the outer peripheral surface 12b of the electrode 11 and onto the inner peripheral surface 22b of the electrode 21, thereby forming a film thereon.

Returning back to FIGS. 5 and 6, description will be made. The holder 30 includes a generally horizontal bottom plate 31 (covered part on the workpiece side), a generally horizontal top plate 32 (covered part on the opposite side to the workpiece), a cylinder 33 (cylindrical covered part) sandwiched between the inner peripheral parts of the bottom plate 31 and the top plate 32, and an insulating ring member 34. Those members are composed of an insulating material such as, for example, polytetrafluoroethylene (corrosion resistant resin). The ring member 34 is fitted to a space formed between the upper end faces of the electrodes 11, 21 and the steps of the passage forming members 15, 25. The electrode structures 10, 20 and the ring member 34 are sandwiched between the bottom plate 31 and the top plate 32. The cylinder 33 is contacted with the inner periphery of the passage forming member 15 of the inner electrode structure 10 to support the passage forming member 15. The bottom plate 31 is divided into an inner side and an outer side.

The frame 40 surrounding the holder 30 to support it includes a generally horizontal bottom plate 41 (covered part on the workpiece side), a generally horizontal top plate 42 (covered part on the opposite side to the workpiece), an inner cylinder 43 (cylindrical inner periphery-side covered part) and an outer cylinder 44 (covered part on the cylindrical outer periphery-side covered part) which are sandwiched between the bottom plate 41 and the top plate 43 and connected to each other by bolts or the like. Those members 41 through 44 are composed of metal such as aluminum, stainless steel and the like. The bottom plate 41 presses the bottom plate 31 of the holder 30 through spacers 49 radially arranged at equal intervals. The top plate 42 presses the top plate 32 of the holder 30. The inner cylinder 43 presses the cylinder 33 and the holder 30 and the inner periphery of the top plate 32. The outer cylinder 44 is contacted with the electrode 21, the passage forming member 25 and the outer periphery of the top plate 32 to press them. No member composed of an insulating material is interposed between the outer cylinder 44 and the electrode 21. The top plate 42 is fixed to a base not shown. Owing to this arrangement, the nozzle head NH2 is supported. The bottom plate 41 is composed of a corrosion-resistant metal (for example, HASTELLOY, merchandise name), and divided into an inner side and an outer side, to the lower surfaces of which thin plates 45 composed of an insulating material are attached, respectively.

As shown in FIG. 6, a connecting contact 106 is passed through the top plate 42 of the frame 40 through an insulating cylinder 105. The lower end of this connecting contact 106 is connected to the upper end of the passage forming member 15. A pulse power supply 100 is connected to the connecting contact 106 through a power supply line 101. Owing to this arrangement, the electrode 11 is connected to the pulse power supply 100 thereby serving as an electric field imparting electrode (hot electrode). The electrode 21 is grounded to the earth through the passage forming member 25 and the frame 40, thereby serving as a grounding electrode (earth electrode).

As shown in FIG. 5, an annular blow-off port (blow-off hole) 1*a* is formed between the members obtained by dividing the bottom plate 31 into the outer side and the inner side. The upper end of this blow-off port 1*a* is connected to the gas passage 1*p* formed between the electrodes 11, 21, and the lower end of the blow-off port 1*a* is open to a chevron-like annular projection 31*a* which is formed on the lower surface of the bottom plate 31. On the other hand, a plurality of joints 72, which are arranged at equal intervals in the peripheral direction, are attached to the top plate 42 of the frame 40. The joints 72 are connected to the upper end of the gas passage 1*p* formed between the electrodes 11, 21, through the top plates 32, 42, a hole 73 (supply passage) formed in the rind member 34, and an annular slit 74 (supply passage) formed in the rind member 34. A processing gas supply 70 is connected to this joint 72 through the supply tube 75. A gas, for example, $CF_4$ is reserved is the processing gas supply 70 as an etching gas.

Figure 8:
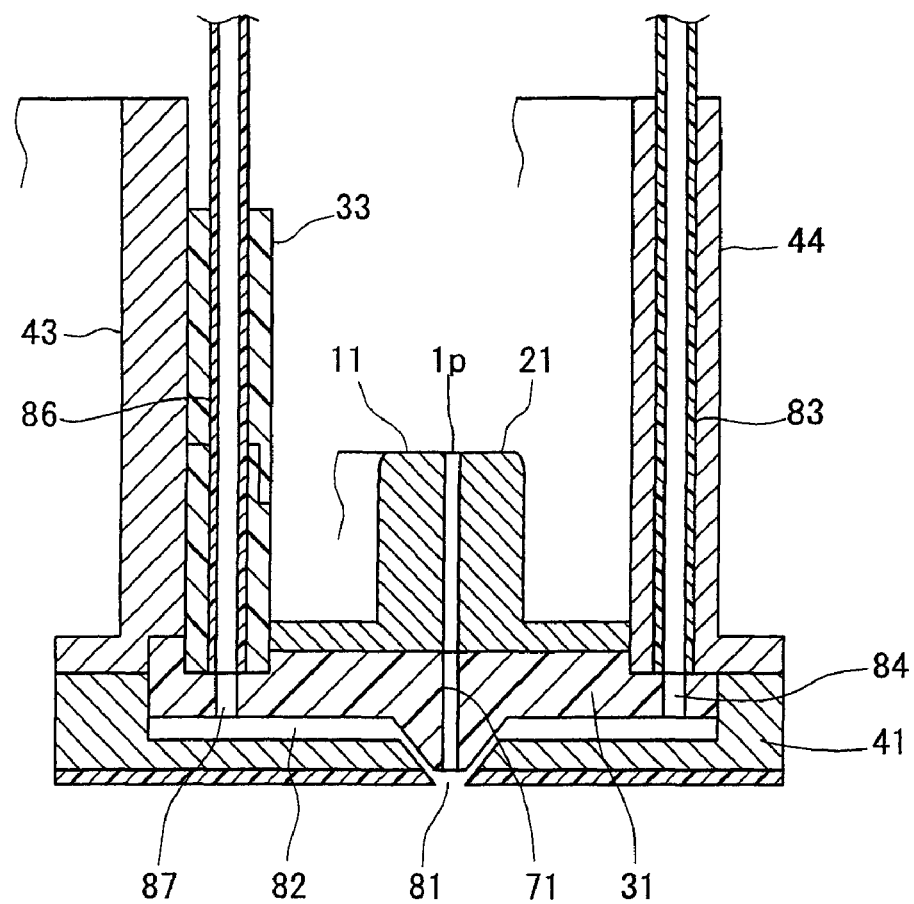
FIG. 8 is an enlarged vertical sectional view showing the structure of an exhaust passage of the nozzle head of the second embodiment.

As best shown in FIG. 8, a taped annular suction port 81 corresponding to the inclination surface of the annular projection 31*a* is formed between the members obtained by dividing the bottom plate 41 into the inner side and outer side. This suction port 81 is connected to an exhaust passage 82 which is disposed immediately under and proximate to the blow-off port 1*a*, which has a larger width than the blow-off port 1*a* and which is defined by a gap formed between the bottom plates 31, 41. A plurality of exhaust tubes 83 (exhaust passage) composed of a corrosion-resistant resin such as polytetrafluoroethylene and arranged at equal intervals in the peripheral direction, are passed through the outer cylinder 44 of the frame 40. The lower ends of those exhaust tubes 83 are connected to the exhaust passage 82 through a through-hole 84 formed in the bottom plate 31. The upper end parts of the exhaust tubes 83 are inserted and connected to a joint 85 installed on the top plate 42.

A plurality of exhaust tubes 86 (exhaust passage) composed of a corrosion-resistant resin such as polytetrafluoroethylene and arranged at equal intervals in the peripheral direction, are passed through the cylinder 33 and the top plate 32 of the holder 30. The lower ends of those exhaust tubes 86 are connected to the exhaust passage 82 through a through-hole 87 formed in the bottom plate 31. The upper end parts of the exhaust tubes 86 are inserted and connected to a joint 88 installed on the top plate 42. The joints 85, 88 are connected to the suction pump 80 through a suction tube 89 composed of a corrosion-resistant resin.

An inlet-side joint 91 and an outlet-side joint 92 are attached to the top plate 42. The inlet-side joint 91 is connected to a coolant supply 90 (temperature adjusting medium supply) through a coolant supply tube 93. Water, for example, is used as the coolant (temperature adjusting medium), and the coolant supply 90 is composed of a water supply pump. The inlet-side joint 91 is connected to the medium passage 17 through the top plates 42, 32 and the through-hole 94 formed in the passage forming member 15. An exhaust tube 95 (discharge tube) is connected to the outlet-side joint 92. The outlet-side joint 92 is connected to the medium passage 27 of the outer electrode structure 20 through the top plates 42, 32 and the through-hole 96 formed in the passage forming member 25. Two relay joints (not shown) are attached to the top plate 42 at a position about 180 degrees away from the joints 91, 92. Those relay joints are connected to each other through a relay joint (not shown). Those relay joints are connected respectively to the medium passage 17 of the inner electrode structure 10 and the medium passage 27 of the outer electrode structure 20 in the same manner as in the joints 91, 92.

Operation of the normal pressure plasma etching apparatus M2 thus constructed will be described. A wafer W as an object to be processed is set to a lower part of the nozzle head NH2. At that time, the center axis of the nozzle head NH2 and the center of the wafer W are aligned to each other. Owing to this arrangement, the outer edge part of the wafer W is located immediately under the annular blow-off port 1*a*.

Next, the processing gas coming from the processing gas supply 70 is uniformly introduced to the entire periphery of the gas passage 1*p* (annular plasmatizing space) through the supply tube 75, the joint 72, the hole 73, and the annular slit 74. In parallel with this processing, a pulse voltage is outputted from the pulse power supply 100 at a predetermined frequency. This pulse voltage is imparted to the electrode 11 through the power supply line 101, the connecting contact 106 and the passage forming member 15. By doing so, a pulse electric field is formed in the gas passage 1*p* between the electrodes 11, 21, and the processing gas passing through the gas passage 10a can be plasmatized by this electric field. The processing gas thus plasmatized is blown off from the entire periphery of the annular blow-off port 1a and sprayed on to the entire periphery of the outer edge of the wafer W. By this, the film 9b formed on the outer edge of the wafer W can be etched at a time over the entire periphery.

Simultaneous with the blowing off of the processing gas, the suction pump 80 is actuated. By doing so, a suction stream directing upwardly (i.e., directing in the reverse direction of the blow-off stream) is formed proximate to the blow-off stream in such a manner as to surround the blow-off stream, the processing gas and the byproduct generated by the etching operation can be prevented from flowing into the inner side from the outer edge of the wafer W, and the film 9a formed on the area which is not to be processed can be protected. The processing gas and the byproduct after the etching operation are sucked into the suction port 81 and then, exhausted via the exhaust passage 82, the exhaust tubes 83, 86 and the suction tube 89.

The coolant coming from the coolant supply 90 is sent into the medium passage 17 of the inner electrode structure 10 via the supply tube 93, the inlet-side joint 91 and the through-hole 94. This coolant is branched into two and flowed within the medium passage 17, then flowed into the medium passage 27 of the outer electrode structure 20 via the relay joint and the relay tube which are generally 180 degrees away from each other, then, branched into two and flowed through the medium passage 27, and finally, exhausted through the water exhaust tube 95 via the through-hole 96 and the outlet-side joint 92. The electrodes 11, 21 heated by electric discharge is cooled in the process for the coolant flowing through the medium passages 17, 27 in the manner as described above and adjusted in temperature so that the temperature of the electrodes 11, 21 will be brought into the predetermined range. Since the coolant flows while directly contacting the electrodes 17, 27, the electrodes 17, 27 can be cooled efficiently.

Although the processing gas and the byproduct have such properties as to corrode metal, the metal-made bottom plate 41 forming the exhaust passage 82 is prevented from being corroded because the bottom plate 41 is composed of a corrosion-resistant metal. Since the exhaust passage of the outer cylinder 44 is formed from the exhaust tube 83 which is composed of a corrosion-resistant resin, the outer cylinder 44 can also be avoided from being corroded. Since the exhaust passage of the outer cylinder 44 is formed merely by passing the exhaust tube 83 through the through-hole which is extended axially, the corrosion-resisting property can be obtained at a low cost.

In this second embodiment, since the connecting contact 61, the joints 72, 85, 88, 91, 92 are installed on the top plate 42 of the frame 40, the connecting structure with respect to the power supply 80, the processing gas supply 70, the suction pump 80 and the coolant supply 90 can be simplified.

Since no component member (member corresponding to the outer cylinder of the holder 30) is interposed between the outer cylinder 44 of the frame 40 and the outer electrode structure 20, the outside diameter of the head NH2 can be reduced. Since the joint 85 is disposed at the top plate 42 as mentioned above, the outer periphery-side exhaust passage must be formed in the outer cylinder 44. However, no inconvenience is encountered because the exhaust tube 83 is employed as mentioned above.

Figure 9:
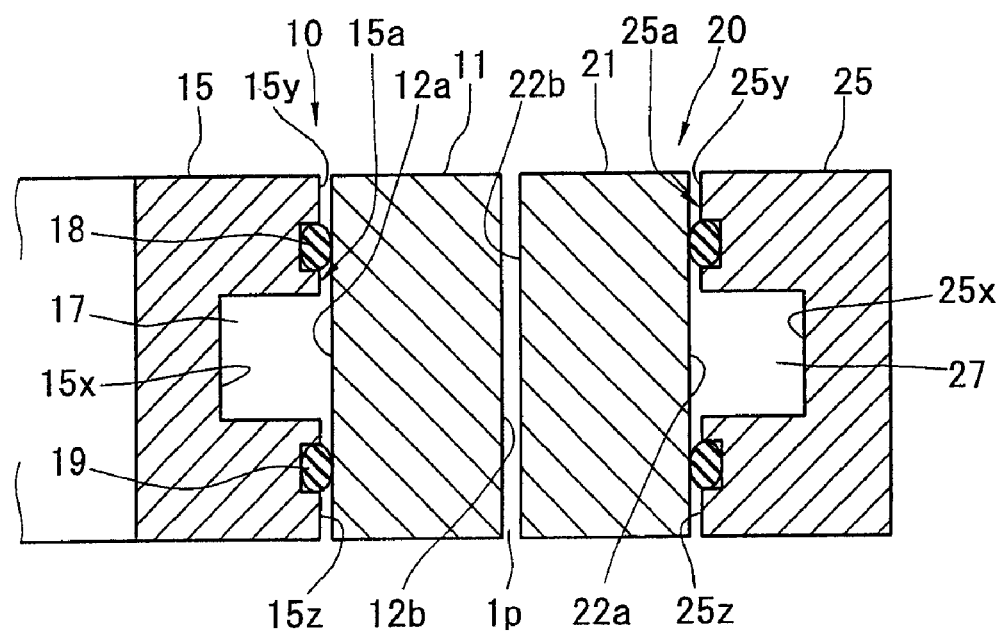
FIG. 9 is an enlarged vertical sectional view of the structure of electrodes showing a modification of the second embodiment.

FIG. 9 shows a modified embodiment of the second embodiment. In FIG. 9, those component corresponding to the embodiment of FIGS. 5 through 8 are denoted by identical reference numeral and detailed description thereof is omitted.

In this modified embodiment, the peripheral surfaces 15a, 25a of the passage forming members 15, 25 include first peripheral surfaces 15y, 25y and second peripheral surfaces 15z, 25z which are composed of cylindrical surfaces having the same diameter. The first seal members 18, 28 and the second seal members 19, 29 composed of an O-ring are attached to the first and second peripheral surfaces, respectively, and they are contacted with the peripheral surfaces 12a, 22a of the electrodes 11, 21, which peripheral surfaces 12a, 22a are defined as cylindrical surfaces. In this construction, the seal structure is simple, and the electrodes 11, 21 and the passage forming members 15, 25 can also be simplified in structure.

In the second embodiment, the temperature adjusting medium is not limited to one which cools the electrodes, and the medium may be one which heats the electrodes in order to maintain the electrodes in a predetermined temperature. In case of heating, a hot water may be employed instead of the normally hot water and cold water.

The first and second seal members may be composed of a plurality of O-rings, respectively.

It is also accepted that the electrodes have a sectional configuration resembling that of the passage forming member of FIG. 7, and the passage forming member have a sectional configuration resembling that of the electrodes of FIG. 7.

The electrode structure may be one which are extended linearly.

Third Embodiment

Figure 10:
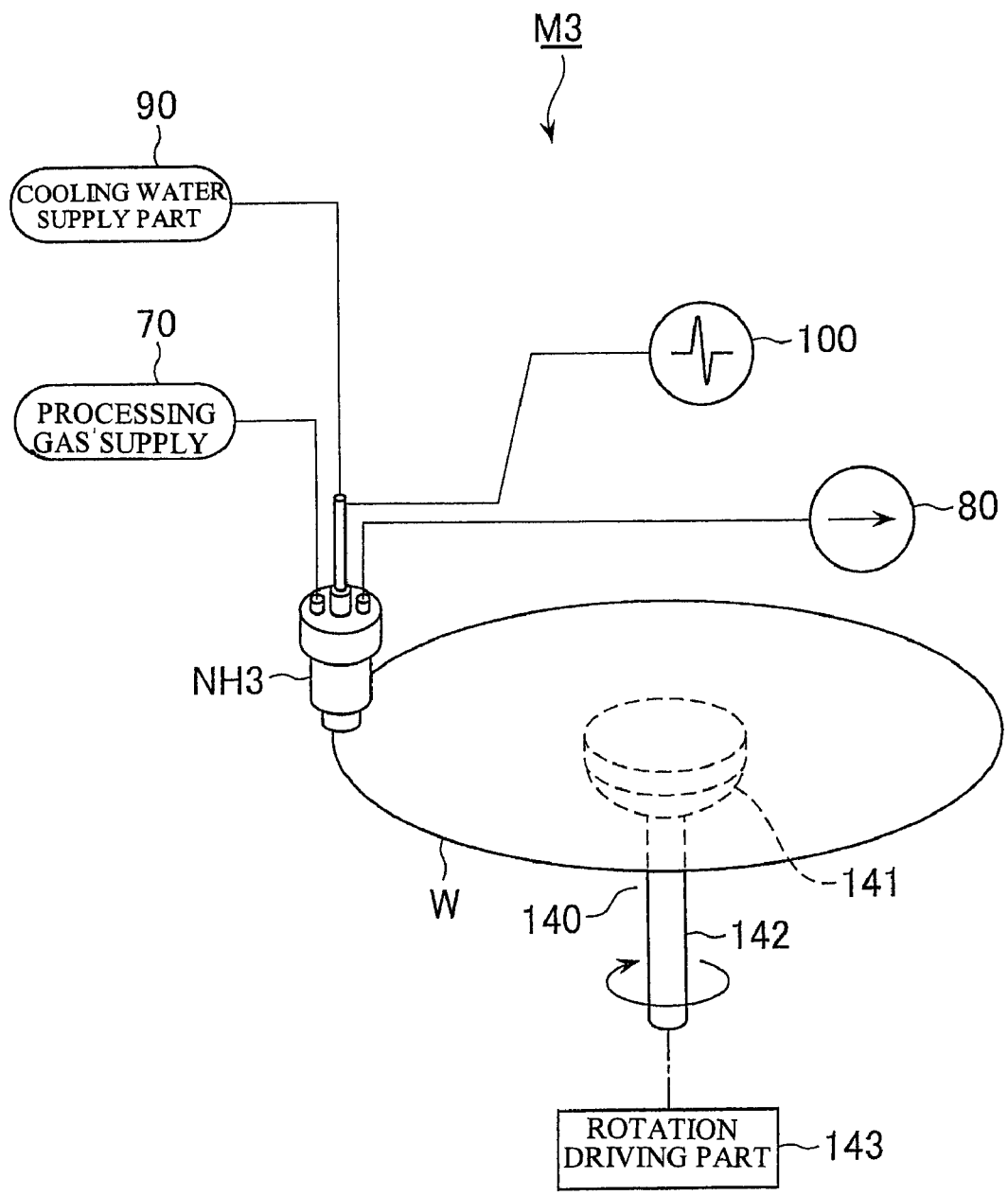
FIG. 10 is a schematic construction diagram of a normal pressure plasma etching apparatus according to a third embodiment of the present invention.

FIG. 10 shows a third embodiment of the present invention. In the third embodiment, the outer edge (part to be processed) of the semiconductor wafer W is plasma etched by a normal pressure plasma etching processing apparatus M3. The film (indicated by an imaginary line in FIG. 12) as an object to be processed formed on the outer edge of the wafer W is denoted by reference numeral 92b and the film (indicated by a solid line in FIG. 12) as an object not to be processed formed on the main area excluding the area denoted by reference numeral 92b of the upper surface is denoted by reference numeral 92a.

The normal pressure plasma etching apparatus M3 will be described.

As shown in FIG. 10, the normal pressure plasma etching apparatus M3 comprises a nozzle head NH3, a processing gas supply 70 and a voltage imparting device 100 which are connected to the nozzle head NH3, and a rotary stage 140 (rotary device, air-stream forming device, and wafer support device). The rotary stage 140 includes a disc-like stage main body 141 (wafer support part), and a rotation driving means 143 for rotating the stage main body 141 about a center axis 142. The wafer W as an object to be processed is horizontally placed on the stage main body 141 with the center of the wafer W aligned with the center of the stage main body 141. Although not shown in detail, a wafer fixing means adapted to vacuum suck the lower surface, i.e., reverse surface of the wafer W is disposed at the stage main body 141.

Figure 11:
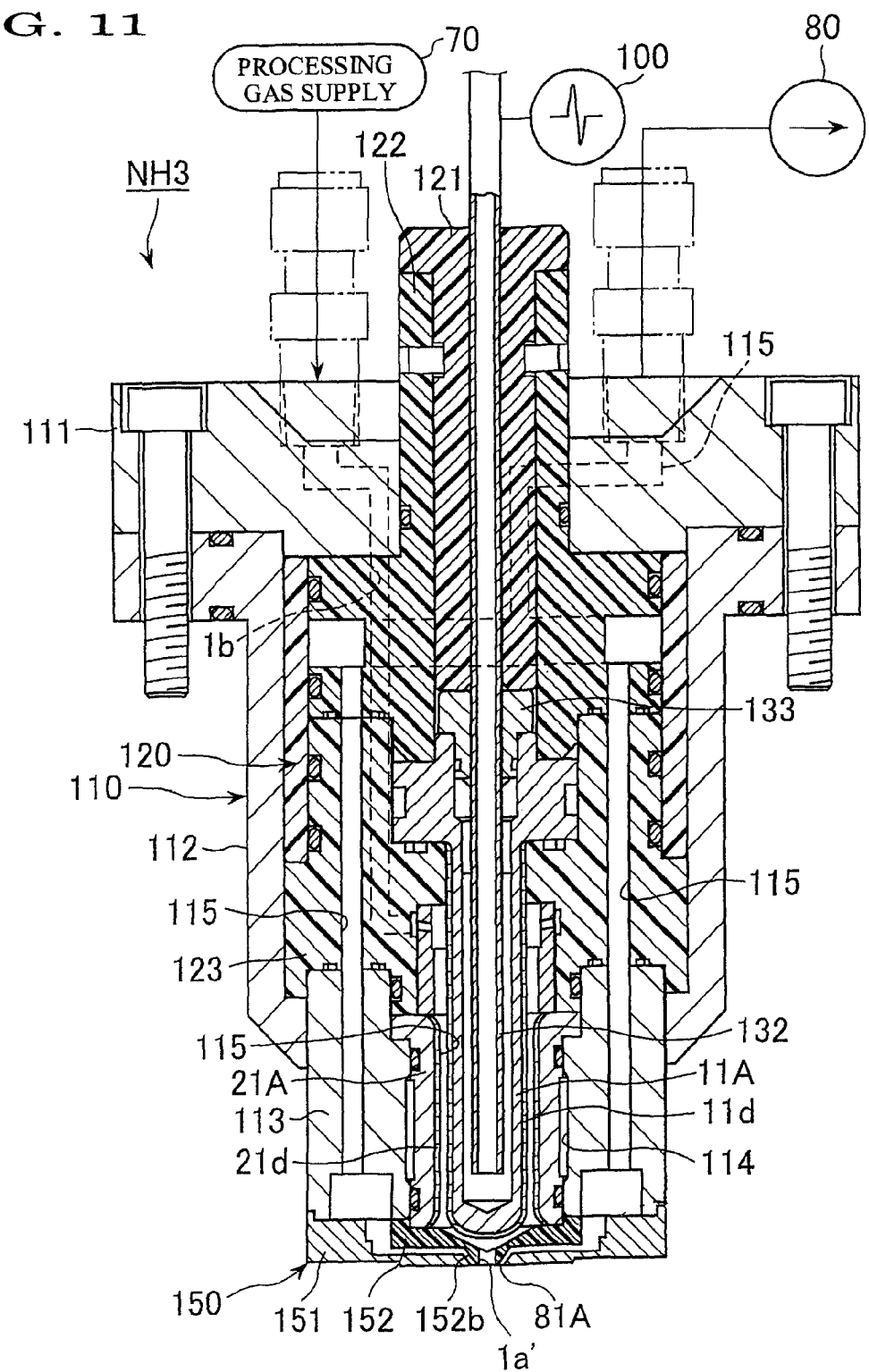
FIG. 11 is a vertical sectional view of a nozzle head of the normal pressure etching apparatus according to the third embodiment.

The nozzle head NH3 is located at an upper part of the outer edge of the wafer W and attached to a base (not shown). As shown in FIG. 11, the nozzle head NH3 comprises a body 110 with its axis directed in the vertical direction and an insulating holder 120 loaded within this body 110. The body 110 has a three-step cylinder-like configuration formed by vertically connecting three body component members 111, 112, 113 which are made of conductive metal. A cylindrical earth electrode 21A is attached to the inner periphery of the lower-step body component member 113. The earth electrode 21A is grounded to the earth through the body 110 and the base. A solid dielectric layer 21*d* is coated on the inner peripheral surface of the earth electrode 21A.

The insulating holder 120 has a cylindrical configuration formed by vertically connected three holder component members 121, 122 and 123 which are made of an insulating resin. A hot electrode 11A having a bottomed cylindrical configuration is attached to the lower holder component member 123. The hot electrode 11A is inserted in the earth electrode 21A. A solid dielectric layer 11*d* is coated on the outer surface of the hot electrode 11A. The lower end part of a pipe 132 which is made of conductive metal, is inserted in the hot electrode 11A. The conductive pipe 132 is conducted at its intermediate part with the hot electrode 11A through a conductive ring 133, and projected at its upper end part upwardly of the holder 120 and connected to the voltage imparting device 100.

The etching processing gas coming from the processing gas supply 70 is introduced into the plasmatizing space 1*p* formed between the electrodes 11A, 21A via the processing gas supply passage 1*b* formed in the body component member 111 of the nozzle NH3, the holder component members 122, 23, etc. A pure gas or mixed gas of, for example, a fluorine compound ($CF_4$, $C2F_6$, $CHF_3$, or the like), oxygen, nitrogen, inert gas (Ar, He, or the like) is used as the etching processing gas.

On the other hand, the voltage coming from the voltage imparting device 100 is imparted to the hot electrode 11A via the conductive pipe 132 and the conductive ring 133. By doing so, an electric field is formed in the plasmatizing space 1*p* and the processing gas is plasmatized therein.

The lower end part of the plasmatizing space 1*p* is connected to a blow-off hole (blow-off port ) 1*a*' of a nozzle part 150 disposed at the lower end part of the body component member 113. The nozzle part 150 includes a conductive metal-made outer nozzle piece 151 and an insulating resin-made inner nozzle piece 152 received in a recess formed in the upper surface of the nozzle piece 151. A reduced-diameter spot-like blow-off hole 1*a*' is formed in the center of the inner nozzle piece 152 with a hole axis L (FIG. 12) directed perpendicularly. The plasmatized processing gas is blown just under from the lower end opening of the blow-off hole 1*a*'. That is, the blow-off direction of the processing gas is orthogonal to (intersected with) the outer surface of the horizontal wafer W.

Figure 12:
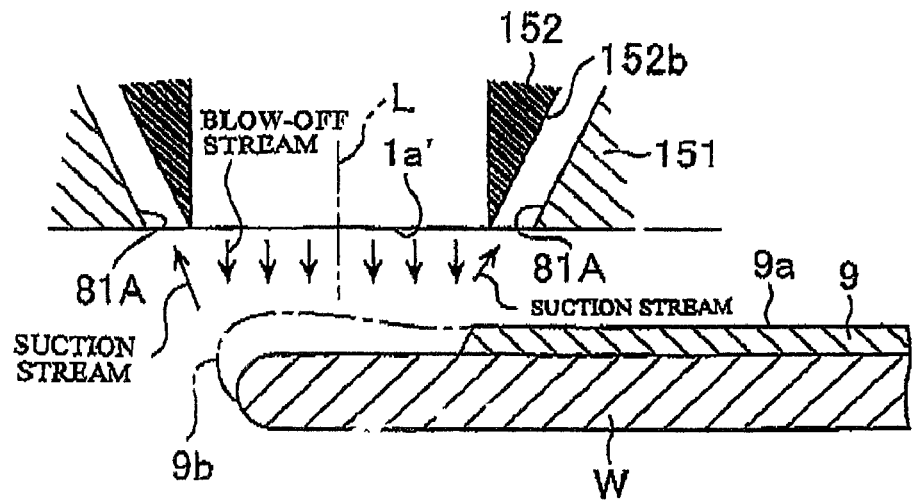
FIG. 12 is a sectional view showing, on an enlarged basis, scale, a nozzle part of a lower end (distal end) of the nozzle head according to the third embodiment and the outer edge of a wafer that is an object to be processed.

As best shown in FIG. 12, the blow-off hole 1*a*' is disposed just above and proximate to the outer edge of the wafer W. The diameter of the blow-off hole 1*a*' is very small and almost equal to the width, i.e., processing width of the film 9*b* to be etched (the blow-off hole 1*a*' is so small in diameter (small in width) as almost equal to the processing width of the outer edge of the wafer W).

Figure 13:
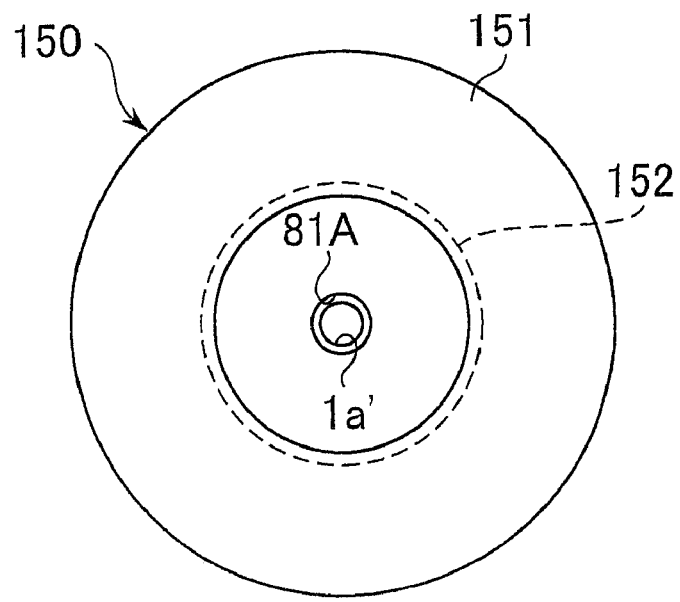
FIG. 13 is a bottom view of the nozzle part of FIG. 12.

As shown in FIGS. 11, 12 and 13, an annular suction hole (suction port) 81A surrounding the blow-off hole 1*a*' is formed between two nozzle pieces 151, 52. An annular projection 31B is disposed at the center of the lower surface of the inner nozzle piece 152 as a partition wall for those holes 1*a*', 81A. The inner peripheral surface (single surface) of the annular projection 31B defines an outer peripheral surface of the tip part of the blow-off hole 1*a*', and the outer peripheral surface (the opposite surface) of the annular projection 31B defines the inner peripheral surface of the tip part of the suction hole 81A. The annular projection 31B is reduced in thickness toward the tip (lower end). More in detail, the inner peripheral surface defining the blow-off hole 1*a*' in the annular projection 31B exhibits a straight configuration of a uniform cross section along the axis of the blow-off hole 1*a*', and the outer peripheral surface defining the suction hole 81A is reduced in diameter downward and exhibits a tapered configuration approaching the blow-off hole 1*a*'. Since the straight surface and the tapered surface are intersected with each other, the lower end (tip) of the annular projection 31B is defined as a knife edge-like configuration. Owing to this arrangement, the inner peripheral edge of the tip opening part of the suction hole 81A and the outer peripheral edge of the tip opening part of the suction hole 81A are contacted with each other.

As shown in FIG. 11, the suction hole 81A is connected to the exhaust pump 80 (exhaust means) through a suction passage 115 sequentially formed in the body component member 113 of the nozzle head NH3, the holder component members 123, 22 and the body component member 111.

As shown in FIG. 10, a cooling water supply part 90 is connected to the upper end opening of the pipe 132. The cooling water coming from this supply part 90 is passed through the pipe 132 and then, passed between the inner periphery of the hot electrode 11A and the outer periphery of the pipe 132. Owing to this arrangement, the hot electrode 11A is cooled. Thereafter, the cooling water is circulated in the space 114 formed between the outer periphery of the earth electrode 21A and the body 13 via a communication water passage (not shown) formed in the holder component member 123 and the body component member 113. By this, the earth electrode 21A is cooled. Thereafter, the cooling water is exhausted via an exhaust passage (not shown) which is sequentially passed through the body component member 113, the body component members 123, 22, and the body component member 111.

A method for etching the outer edge of the wafer W using the normal pressure plasma etching apparatus thus constructed will be described.

After a film 92 is formed by a coating process, the wafer W is set on to the rotary stage 140. Then, the rotary stage 140 and thus, the wafer W is rotated at a predetermined speed of rotation. A method for setting the speed of rotation will be described later.

Then, the processing gas coming from the processing gas supply 70 is introduced into the plasmatizing space 1*p* of the nozzle head NH3, and an electric field is imparted to the plasmatizing space 1*p* by the voltage imparting device 100 so as for the processing gas to be plasmatized. Then, the plasmatized processing gas is blown off through the blown-off hole 1*a*'. By doing so, as shown in FIG. 12, a plasma is sprayed on to the outer edge part of the upper surface of the wafer W, so that the film 9*b* formed on the outer edge part can be etched for removal. Owing to the feature that the blow-off hole 1*a*' is slightly expanded radially outwardly of the wafer W, the plasma is also applied to the outer end face of the wafer W so that the film 9 formed on this outer end face can also be etched for removal.

Moreover, since the blow-off stream from the blow-off hole 1*a*' is very narrow, it is possible to arrange such that the processing gas applies only to the outer edge (outer edge part of the upper surface and the end face) of the wafer W. That is, it can be arranged such the processing gas is not applied directly to the film 9*a* formed on the main area, i.e., area not to be process, at the inner side of the outer edge part of the upper surface of the wafer W, and thus, the film 9*a* formed on the area which is not to be processed can be protected.

Moreover, simultaneously with the blow-off of the processing gas, the exhaust pump 80 is actuated. By doing so, a sucking stream is formed proximate to the blow-off stream in such a manner as to surround the blow-off stream. By this, the stream of the processing gas and the by product generated by etching can be controlled with ease. Thus, they can be prevented from flowing to the main area of the wafer W more reliably and the film 9a, which is not an object to be processed, can be protected more reliably. Thus, it is not required to cover the film 9a and to seal the boundary area between the film 9a and the film 9b. As a result, it becomes possible to eliminate the possibility to generate fine dusts which would otherwise be generated as a result of cracking of the film 9a, and the contamination can more reliably be prevented from occurrence. Thus, the yield of production can be enhanced.

The processing gas and byproduct after etching are sucked into the suction hole 81A and exhausted from the exhaust pump 80 via the suction passage 115. By controlling the output of the exhaust pump 80 and thus, by controlling the flow ratio between the blow-off and the suction of the processing gas, not only the etching width (processing width) but also the etching profile, i.e., inclination angle of the peripheral end face of the film 9a after the film 9b, that is an object to be processed, can be adjusted.

In parallel with the blowing off processing of the processing gas, the wafer W is rotated, thereby the outer edge of the wafer W can be etched over the entire periphery.

As apparent from the experiment result (Experiment 1 as later described) of FIG. 14, the etching rate (processing rate) with respect to the speed of rotation of the wafer W draws a parabolic curve convexly expanding upwardly. Thus, the speed of rotation of the rotary stage 140 is set so that the etching rate will be generally maximized. By doing so, the processing efficiency of the etching can be enhanced. Incidentally, an air-stream directing in the direction away from the wafer W is formed on the periphery of the outer edge of the wafer W along the tangential direction by the rotation of the rotary stage 140. By this air-stream, the byproduct can be scattered outward from the etching spot on the outer edge of the wafer W. However, if the force of the air-stream is too large, it becomes difficult for the blow-off stream of the processing gas from the blow-off hole 1a' to reach the wafer W. It can be contemplated that the etching rate varies according to the speed of rotation because of this reason. Accordingly, by setting the speed of rotation of the rotary stage 140 and thus, by setting the force of the air-stream so that the blow-off steam is allowed to reach the wafer W and that the byproduct can satisfactorily be scattered, the processing efficiently can fully be enhanced.

The byproduct scattered by the air-stream can be sucked and removed by an exhaust mechanism separately employed.

In the normal pressure plasma etching processing apparatus M3, the nozzle head NH3 may be disposed at an upper part of and proximate to the outer edge part of the wafer W. Since the nozzle head NH3 is not greatly projected radially outwardly of the wafer W, miniaturization can be achieved. Accordingly, this apparatus can be assembled to the conventional spin coater with ease in such a manner as to be replaced with the wet etching mechanism.

The hole axis of the blow-off hole 1a' may be slightly inclined with respect to the direction orthogonal to the outer surface of the wafer W.

It is also accepted that a nozzle head is provided also to the lower side (reverse side) of the wafer W, so that the outer edge part of the lower surface (reverse surface) of the wafer W can be cleaned and the film formed so far as on the lower surface can be etched.

The formation of a film on the wafer may be carried out in accordance with not only the spin coating method, but also with other film forming methods such as the normal pressure CVD method, the plasma method and the like.

EXPERIMENT EXAMPLE 1

Figure 14:
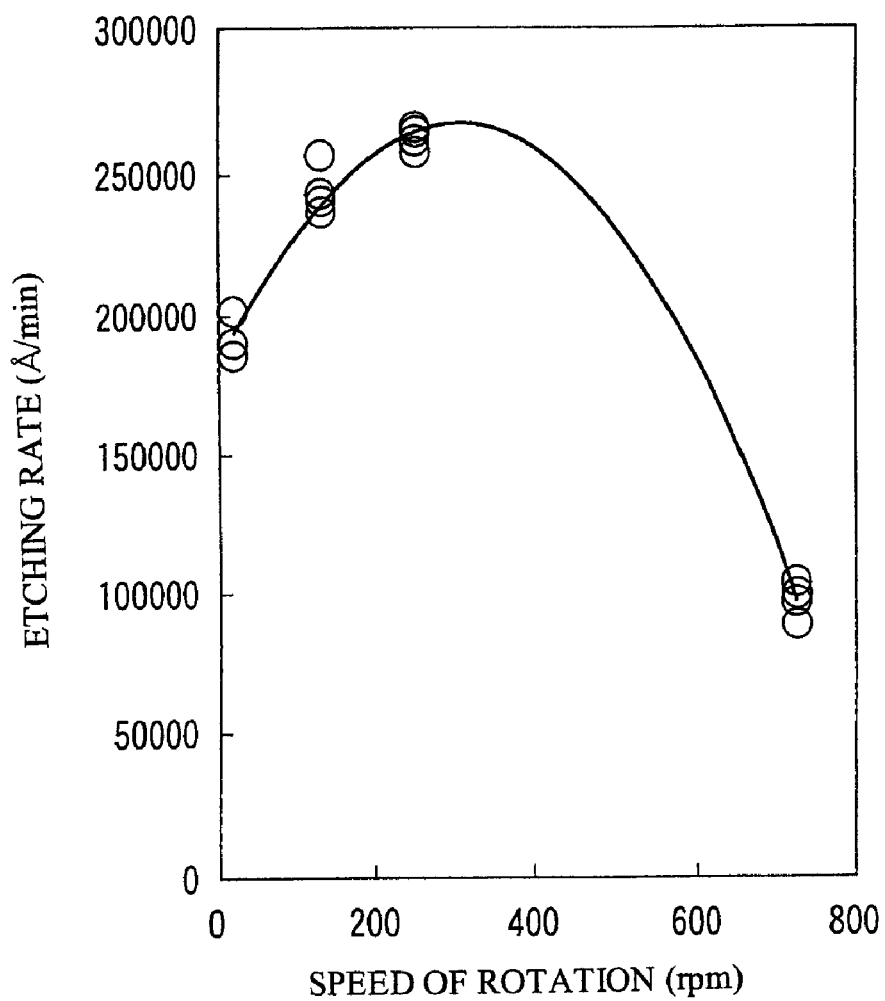
FIG. 14 is a graph showing the result of experiment concerning a relation between speed of rotation and etching rate of the wafer in Experiment 1.

The inventors carried out an experiment on etching rate with respect to the speed of rotation under the under-mentioned conditions, using the same apparatus as the apparatus M3 according to the third embodiment shown in FIG. 10.

diameter & thickness of silicon wafer: 200 mm φ, 0.725 mm t
film component: inorganic Low -k film
processing gas: 260 sccm of $CF_4$, 5.0 sccm of $H_2O$
flow ratio between blow-off and suction: 2.0
imparting voltage: 10 kV, 20 k Hz
working distance: 0.5 mm The result is shown in FIG. 14. The etching rate exhibited a parabolic curve convexly curved upward. It was known that the limited speed of rotation exists where the etching rate becomes maximum. It was known that the etching rate can be controlled by adjusting the speed of rotation.

Fourth Embodiment

Figure 15:
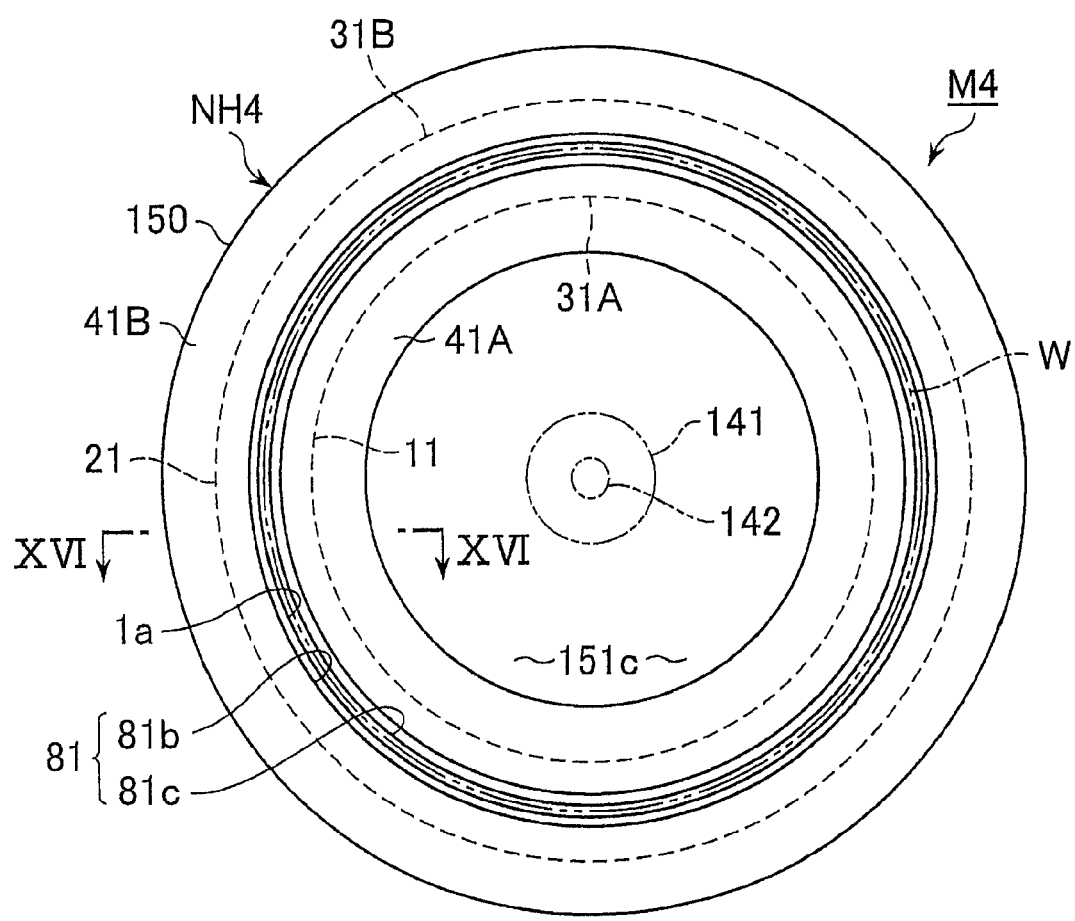
FIG. 15 is a bottom view of a normal pressure plasma etching apparatus according to a fourth embodiment of the present invention.
Figure 16:
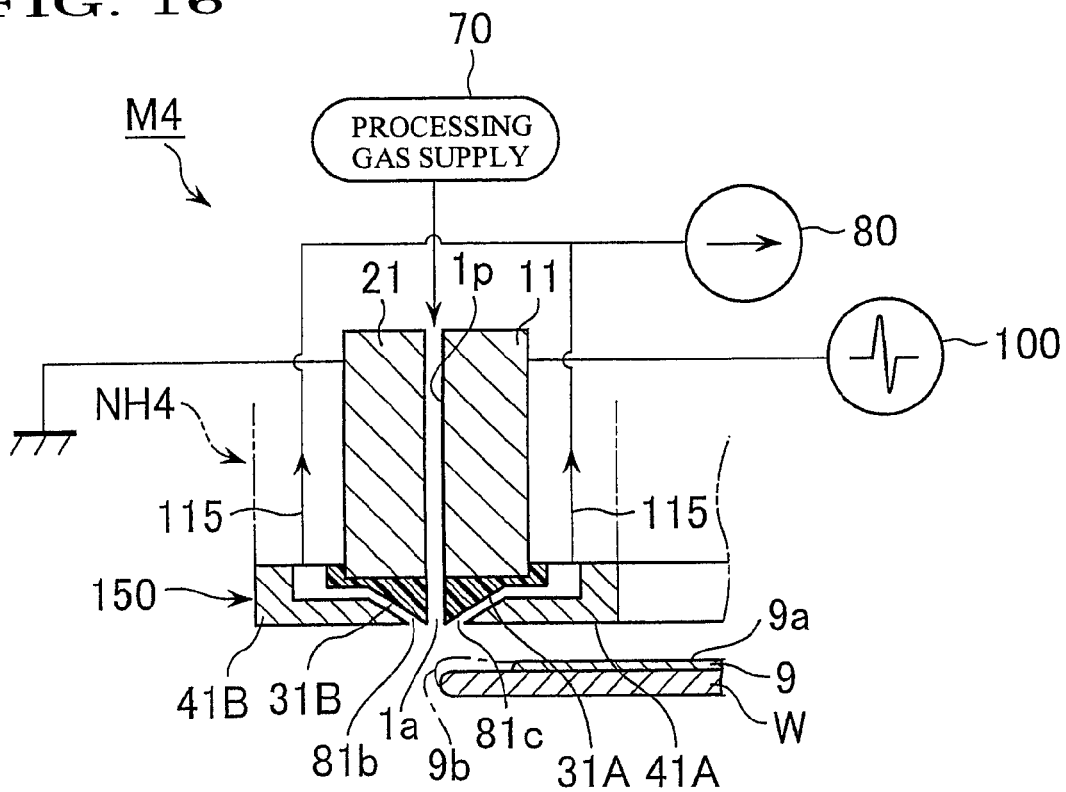
FIG. 16 is a schematic construction diagram of the normal pressure plasma etching apparatus according to the fourth embodiment including a section of a nozzle head taken on line XVI-XVI of FIG. 15.

As showing FIGS. 15 and 16, a nozzle head NH4 of a normal pressure plasma etching processing apparatus M4 according to a fourth embodiment of the present invention has an annular configuration, in a cross section, along the outer edge of a circular wafer W. Electrodes 11, 21 having a double annular configuration are received in this nozzle head NH4.

More in detail, the hot electrode 11 and the earth electrode 21 of the apparatus M4 have annular configurations which are different in size from each other and which are arranged on a concentric circle. In this embodiment, the hot electrode 11 is disposed at the inner side and the earth electrode 21 is disposed at the outer side. However, they may be disposed in a reverse manner. The diameter of the peripheral surfaces of the electrodes 11, 21 proximately confronted with each other is generally equal to the diameter of the wafer W. The space between the confronting peripheral surfaces of those electrodes 11, 21 serves as the annular plasmatizing space 1p having an annular configuration of a small width. The nozzle head NH4 of the apparatus M4 is provided with a gas uniforming/introducing part (see reference numeral 19 of FIG. 18) for uniforming the etching processing gas coming from the processing gas supply 70 in the peripheral direction of the plasmatizing space 1p and then introduced in the upper end opening of the space 1p.

In FIG. 15, the width dimensions (difference of the radii between the outer periphery and the inner periphery) of the electrodes 11, 21 are shown in an exaggerated manner with respect to the size of the wafer W.

A pair of nozzle pieces 31A, 31B having a double annular configuration are disposed at the lower parts of the electrodes 11, 21. A nozzle hole 1a having an annular configuration of a reduced width is formed between those nozzle pieces 31A, 31B. The nozzle hole 1a is connected to the plasmatizing space 1p over the entire periphery. This blow-off hole 1a is disposed just above and proximate to the wafer W in such a manner as to extend along the entire periphery of the outer edge of the wafer W. The width (difference of radii between the outer edge and the inner edge in the radial direction) is set to be slightly larger than the width of the film 9b as an object to be processed formed on the outer edge of the wafer W. In more detail, the outer edge of the blow-off hole 1a is located slightly radially outwardly of the outer edge of the wafer W, and the inner edge of the blow-off hole 1a is located in the vicinity of the boundary between the film 9a as an object to be processed and the film 9b as an object not to be processed.

The nozzle pieces 31A, 31B are surrounded by a pair of nozzle pieces 41A, 41B from the inner and outer sides. An inner suction port part 81c is defined by the inner nozzle piece 31A and the nozzle piece 41A. The suction port part 81c has an annular configuration extending along the inner edge of the blow-off hole 1a. The suction port part 81c is inclined radially outwardly so as to approach the blow-off hole 1a toward the tip. By the outer nozzle pieces 31B, 41B, the outer suction piece part 81b is formed.

The suction port part 81b has an annular configuration extending along the outer edge of the blow-off hole 1a. The suction port part 81b is inclined radially inwardly in such a manner as to approach the blow-off hole 1a toward the tip. Suction passages 115 are extended from the respective suction port parts 81b, 81c and then converged so as to be connected to the exhaust pump 80, The inner nozzle piece 31A serves as a partition wall for partitioning the blow-off hole 1a and the inner suction port part 81c. The outer peripheral surface (surface defining the inner peripheral surface of the blow-off hole 1a) of the nozzle piece 31A is vertical, and the inner peripheral surface (surface defining the outer peripheral surface of the suction port part 81c) of the nozzle piece 31A is such tapered as to be enlarged in diameter downwardly. Owing to this arrangement, the lower end (tip) of the nozzle piece 31A is sharpened like a knife edge. The inner peripheral edge of the tip opening of the blow-off hole 1a and the outer peripheral edge of the tip opening of the suction port part 81c are contacted with each other.

Similarly, the outer nozzle piece 31B serves as a partition wall for partitioning the blow-off hole 1a and the outer suction port part 81b. The inner peripheral surface (surface defining the outer peripheral surface of the blow-off hole 1a) of the nozzle piece 31B is vertical, and the outer peripheral surface (surface defining the inner peripheral surface of the suction port part 81b) is such tapered as to be reduced in diameter downwardly. Owing to this arrangement, the lower end (tip) of the nozzle piece 31B is sharpened like a knife edge, the outer peripheral edge of the tip opening of the blow-off hole 1a and the inner peripheral edge of the tip opening of the suction port part 81b are contacted with each other.

In FIGS. 15 and 16, the width dimensions (difference of radii between the outer peripheral surface and the inner peripheral surface) of the annular electrodes 11, 21 and the nozzle pieces 31A, 31B, 41A, 41B are shown in an exaggerated manner with respect to the size of the wafer W. The nozzle head NH4 is only slightly expanded radially outwardly of the wafer W, and so, the construction of the apparatus is not increased in size.

According to the apparatus M4 of the fourth embodiment, the processing gas plasmatized in the annular space 1p can be uniformly sprayed on to the entire periphery of the outer edge of the wafer W through the annular blow-off hole 1a, the film 9b formed on the outer edge can be etched over the entire periphery at a time, and thus, the processing can be carried out in a more efficient manner.

In the fourth embodiment, it is also desirous that the wafer W is rotated at a predetermined speed by the rotary stage 140 and that an air-stream having a predetermined force is generated at the periphery of the outer edge. Owing to this arrangement, the etching rate can be maximized and the processing efficiency can further be enhanced. It is accepted that by sending an air and an inert gas into the central hole part 151C of the annular outer nozzle piece 151 from above and passing them between the lower surface of the outer nozzle piece 151 and the wafer W, an air-stream having a predetermined force directed in the direction radially outwardly away from the wafer W is formed at the periphery of the outer edge of the wafer W.

Fifth Embodiment

Figure 17:
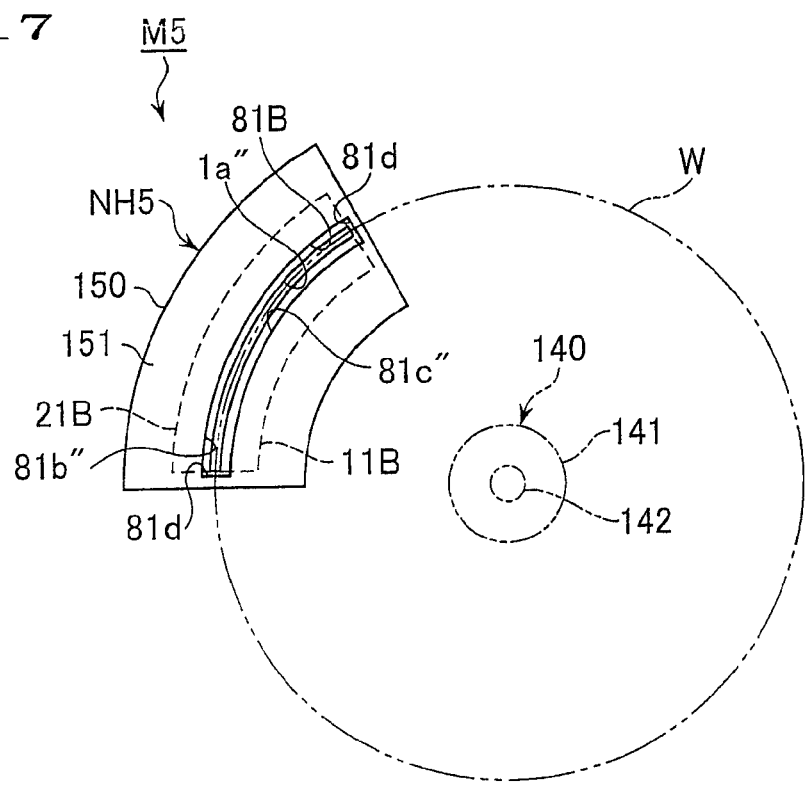
FIG. 17 is a bottom view of a nozzle head of a normal pressure plasma etching apparatus according to a fifth embodiment of the present invention.

As shown in FIG. 17, a nozzle head NH5 of a normal pressure plasma etching processing apparatus M5 according to a fifth embodiment of the present invention is obtained by taking out only a part of the annular nozzle head NH4 of the fourth embodiment in the peripheral direction and forming the nozzle head into an arcuate configuration in a plan view. That is, the electrodes 11B, 21B and the blow-off hole 1a'' of the nozzle head NH5, and the outer and inner suction port parts 81b'', 81c'' of the suction hole 81B are already formed into an arcuate configuration in a plan view about the center axis 142 of the rotary stage 140. The suction hole 81B includes the arcuate suction port parts 81b'', 81c'' and in addition, a pair of end port parts 81d for connecting the opposite ends in the peripheral direction of the suction port parts 81b'', 81c''.

Of course, in the apparatus M5, the entire periphery of the outer edge of the wafer W is etched by rotating the wafer W by the rotary stage 140.

In the apparatuses M4 and M5 according to the fourth and fifth embodiment, it is accepted that only one of the outer suction port parts 81b, 81b'' and the inner suction port parts 81c, 81c'' carries out the sucking operation. It is also accepted that the sucking flow rates through the outer and inner port parts 81b, 81c (81b'', 81c'') are different from each other, and that they care separately adjusted. In the alternative, of all the port parts 81b, 81c (81b'', 81c''), only one may be formed.

Sixth Embodiment

Figure 18:
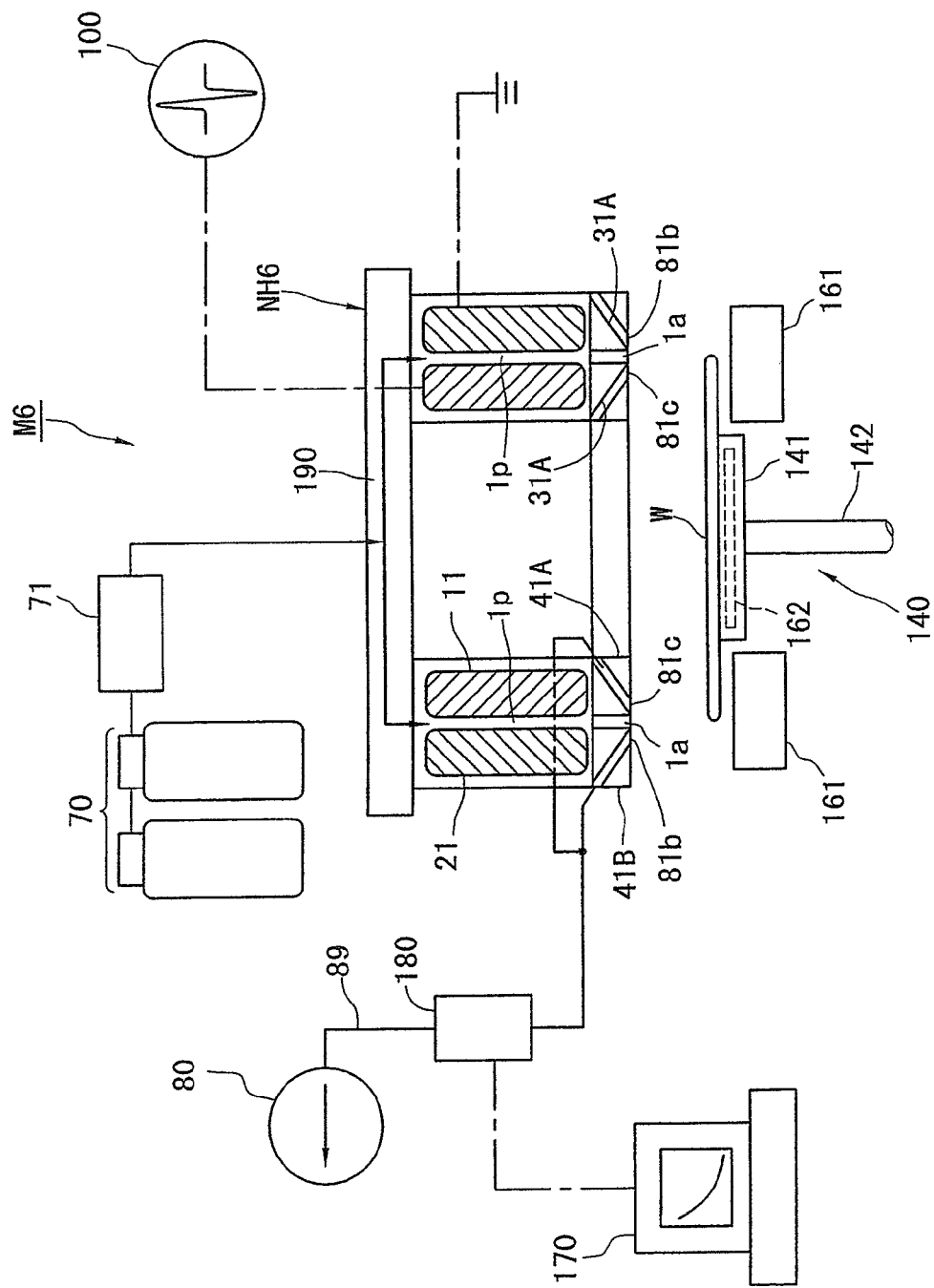
FIG. 18 is a schematic construction diagram of a normal pressure plasma etching apparatus according to a sixth embodiment of the present invention.

As shown in FIG. 18, a normal pressure plasma etching processing apparatus M6 according to a sixth embodiment of the present invention comprises an annular nozzle head NH6 which is similar to the nozzle head NH4 of the fourth embodiment. The processing gas coming from the processing gas supply 70 is controlled in a mass-flow controller (hereinafter referred to as "MFC") 71 and then, supplied to the gas uniforming introducing part 190 of the nozzle head NH6. After being uniformed in the peripheral direction at this gas introduction part 190, the processing gas is introduced into the annular plasmatizing space 1p formed between the co-axial double annular electrodes 11, 21. Then, the processing gas is plasmatized by the electric field imparted thereon by the voltage imparting device 100, uniformly blown off from the entire periphery of the annular blow-off hole 1a (blow-off port) and uniformly sprayed on to the entire periphery of the outer edge of the wafer W. By doing so, the entire periphery of the outer edge of the wafer W can be plasma etched at a time.

At the same time, the stage main body 141 of the rotary stage 140 is rotated at a predetermined speed to enhance the etching rate.

The rotary stage main body 141 is provide at its periphery with an annular first heating means 161 for heating the outer edge part of the wafer W over the entire periphery. Owing to this arrangement, the etching rate can further be enhanced. Moreover, a second heating means 162 for heating the center part of the wafer W is installed within the rotary stage main body 141. Owing to this arrangement, the wafer W can be entirely heated and warping due to temperature difference can be prevented from occurrence, and the heat can be prevented from escaping to the central part from the outer edge part of the wafer W.

Simultaneous with the blow-off of the processing gas, the processed gas is sucked through the suction port parts 81b, 81c disposed along the outer periphery and the inner periphery of the blow-off hole 1a, and then exhausted from the exhaust pump 80 via the exhaust tube 89. This exhausting quantity and thus, the sucking flow rate through the suction port parts 81b, 81c can be adjusted by the flow rate control valve 180 disposed at the exhaust tube 89.

The flow rate control valve 180 is controlled by a controller 170 (control means). Although detailed illustration is omitted, The controller 170 stores therein an etching width setting means (processing width setting means) for allowing the operator to set and input the desired setting width (processing width) of the wafer W, a table showing the relation (see FIG. 19) with the flow ratio between the blow-off and the suction of the processing gas, and the actuating circuit of the flow rate control valve 180, etc. The control means 70 obtains a required sucking flow rate based on the setting/inputting value of the etching width, and controls the flow rate control valve 180 so as to obtain the required sucking flow rate. Owing to this arrangement, a required etching width can be obtained.

If the blow-off flow rate of the processing gas is constant, the etching width is reduced as sucking flow rate is increased.

It is accepted that the controller 170 is designed to control the MFC 71 with the help of the flow rate control valve 180, so that the flow ratio between the blow-off and suction can be controlled. The controller 170 constitutes a "flow ratio adjusting means" together with the MFC 71 and the flow rate control valve 180.

In the apparatus M6 of the sixth embodiment, a working distance adjusting means may further be employed. This working distance adjusting means causes the rotary stage 140 and the nozzle head to move toward or away from each other by moving them upwardly and downwardly, and thus, to adjust the working distance WD (i.e., interval between the blow-off port 1*a* ad the wafer W. By this, adjustment can be made such that a desired processing width and a desired configuration (i.e., etching profile) of the slope of the peripheral edge part of the film 9*a* after processed can be obtained.

EXPERIMENT EXAMPLE 2

Figure 19:
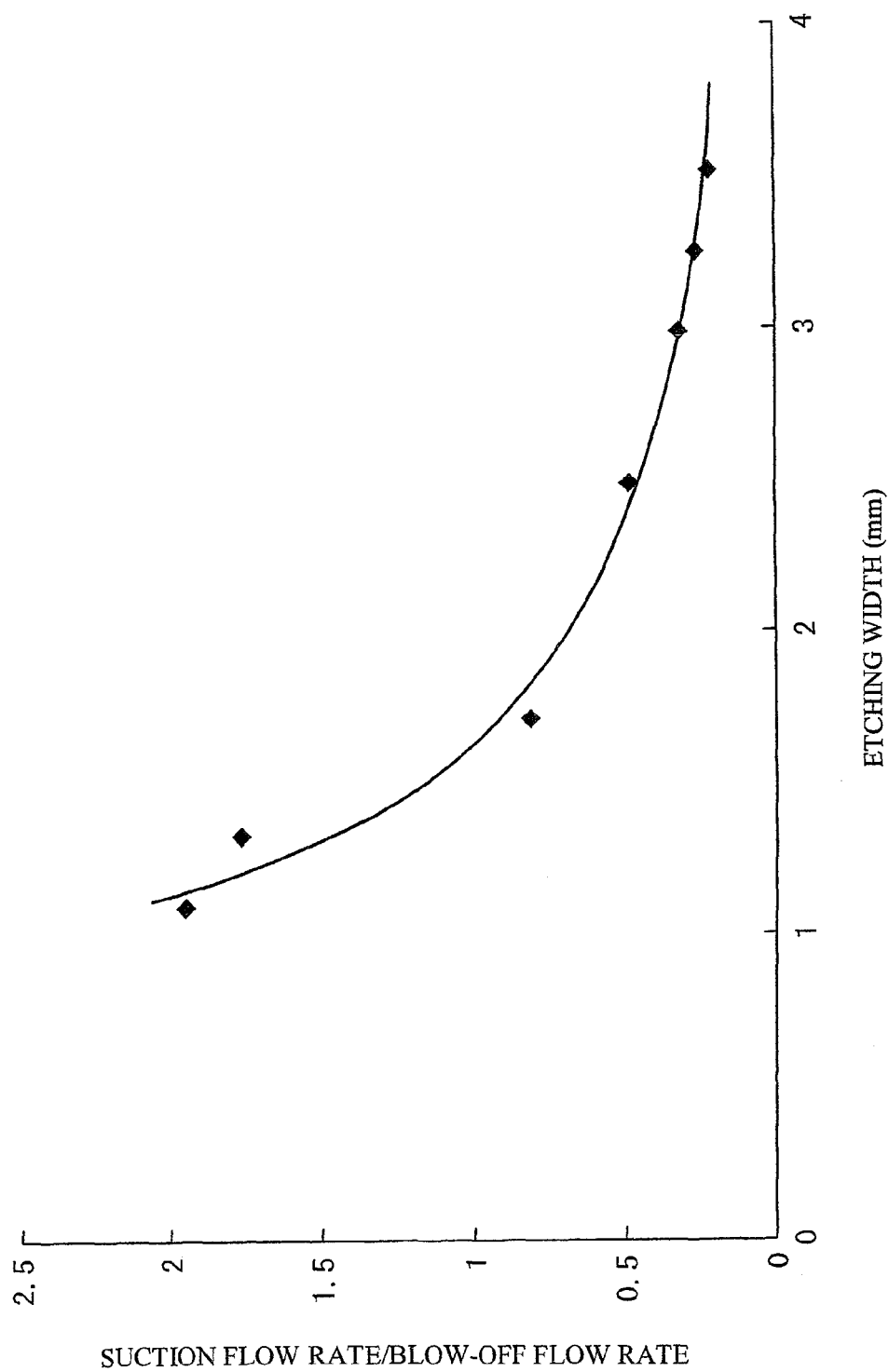
FIG. 19 is a graph showing the result of measurement concerning a corresponding relation between etching processing width and flow rate in Experiment 2

The inventors used the same apparatus as the apparatus M6 of the sixth embodiment. However, the inner suction port part 81*c* was blocked and the sucking operation was carried out only through the outer suction port part 81*b*. Then, the relation between the processing width and the flow ratio between the blow-off and the suction were measured under the following conditions.
film component: $SiO_2$
film thickness: 2500 Å
processing gas: $CF_4$
blow-off flow rate: 4 l/min.
processing time: 30 sec.
speed of rotation: 250 rpm
working distance: 1.0 mm The result is shown in FIG. 19. It can be confirmed that as the flow rate of suction with respect to blow-off is increased, the etching width is reduced.

EXPERIMENT EXAMPLE 3

Figure 20:
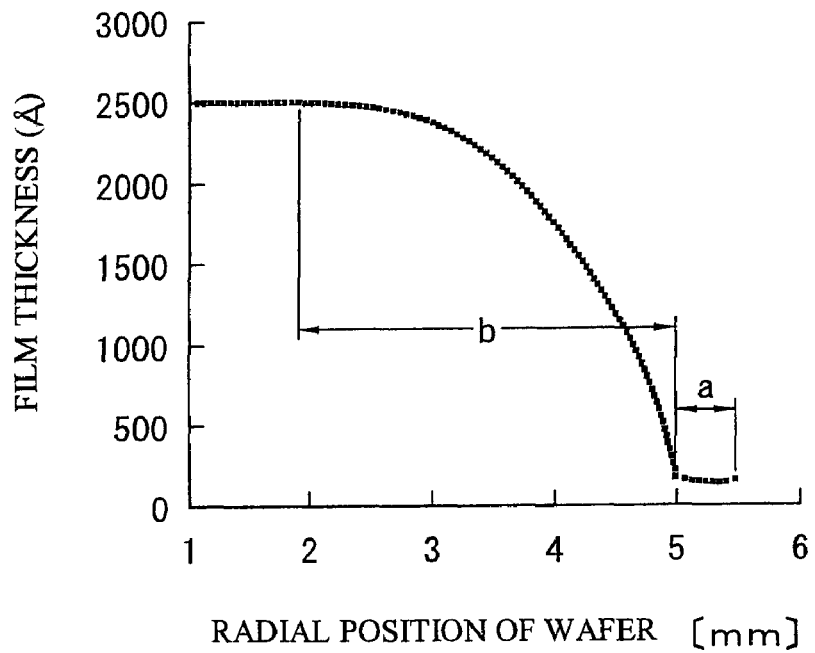
FIG. 20 is a graph showing the result of measurement of film thickness with respect to a radial position of a wafer in Experiment 3.

The inventors carried out the etching operation using the same apparatus M6 as in the sixth embodiment under the under-mentioned conditions and measured the thickness of film radially outwardly from an optional position (gradation (1) on the axis of abscissa FIG. 20) of the wafer.
film component: $SiO_2$
film thickness: 2500 Å
processing gas: $CF_4$
blow-off flow rate: 4 l/min.
processing time: 30 sec.
speed of rotation: 250 rpm
working distance: 1.0 mm
sucking quantity of outer suction port part 81*b*: 5 l/min.
sucking quantity of inner suction port part 81*c*: 5 l/min.

The result is shown in FIG. 20. The etching processing width a was a=0.46 mm. The slop width b at the peripheral eng of the film 9*a* after etching was b=3.1 mm. The film could all be removed over the entire periphery of the outer end face of the wafer including the notch part.

EXPERIMENT EXAMPLE 4

Figure 21:
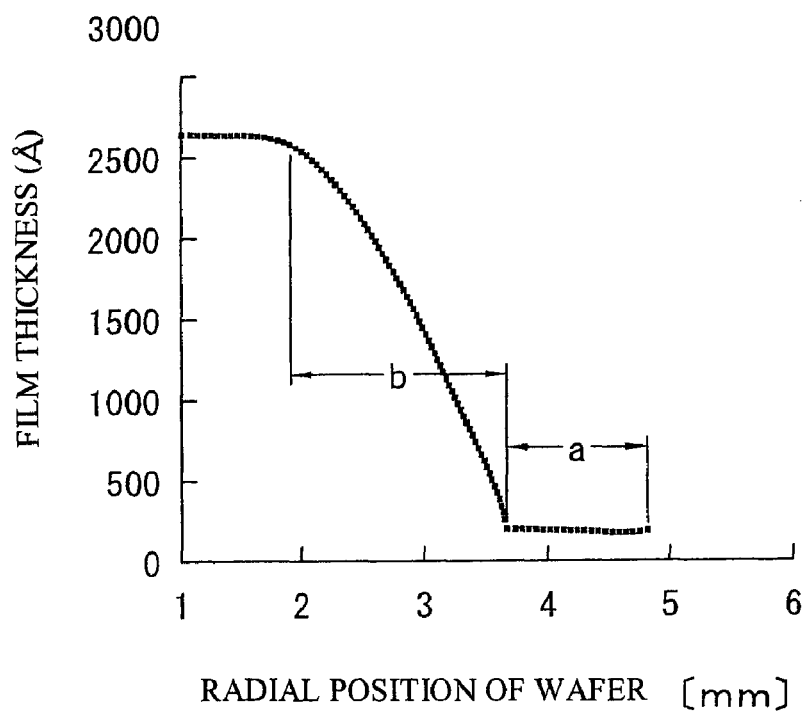
FIG. 21 is a graph showing the result of measurement of film thickness with respect to a radial position of a wafer in Experiment 4.

The inventors carried out the etching operation under the same condition as in the above-mentioned Experiment Example 3 only except that the inner suction port part 81 was blocked so that the sucking quantity through this port part 81 becomes zero, and measured the thickness of film radially outwardly from an optional position (gradation (1) on the axis of abscissa FIG. 21) of the wafer.

The result is shown in FIG. 21. The processing width a was a=1.01 mm. The slop width b was b=1.5 mm.

From the results of Experiment Examples 3 and 4, it was known that the etching width and the slop width, and thus, the etching profile can be controlled by adjusting the flow rates of the inner and outer suction port parts 81*c*, 81*b*.

EXPERIMENT EXAMPLE 5

Figure 22:
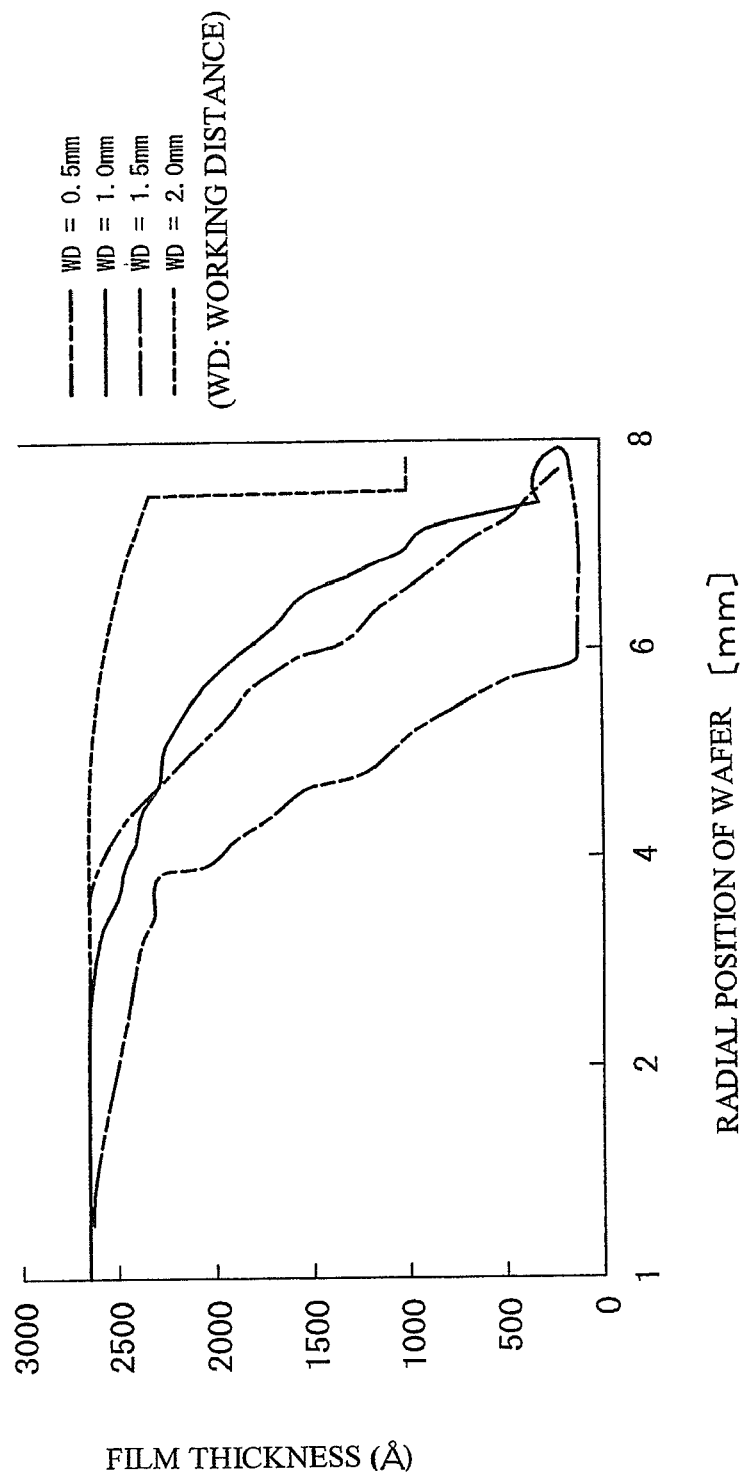
FIG. 22 is a graph showing the result of measurement of film thickness with respect to a radial position of a wafer in Experiment 5.

The inventors carried out the etching operation using the same apparatus as in the sixth embodiment under the under-mentioned conditions only except that the working distance (WD) was changed and measured the thickness of film radially outwardly from an optional position (gradation (0) on the axis of abscissa FIG. 22) of the wafer.
film component: $SiO_2$
film thickness: 2500 Å
processing gas: $CF_4$
blow-off flow rate: 4 l/min.
processing time: 30 sec.
speed of rotation: 250 rpm
sucking quantity of outer suction port part 81*b*: 5 l/min.
sucking quantity of inner suction port part 81*c*: 5 l/min.

The result is shown in FIG. 22. It was known that the etching width and the slop width, and thus, the etching profile can be adjusted by changing the working distance.

EXPERIMENT EXAMPLE 6

The inventors carried out the etching operation using the same apparatus as in the sixth embodiment under the under-mentioned conditions only except that the speed of rotation was changed and measured the depth of etching (processing depth).
film component: $SiO_2$
film thickness: 2500 Å
processing gas: $CF_4$
blow-off flow rate: 4 l/min.
processing time: 20 sec.
working distance: 1.0 mm
sucking quantity of outer suction port part 81*b*: 5 l/min.
sucking quantity of inner suction port part 81*c*: 5 l/min.

Figure 23:
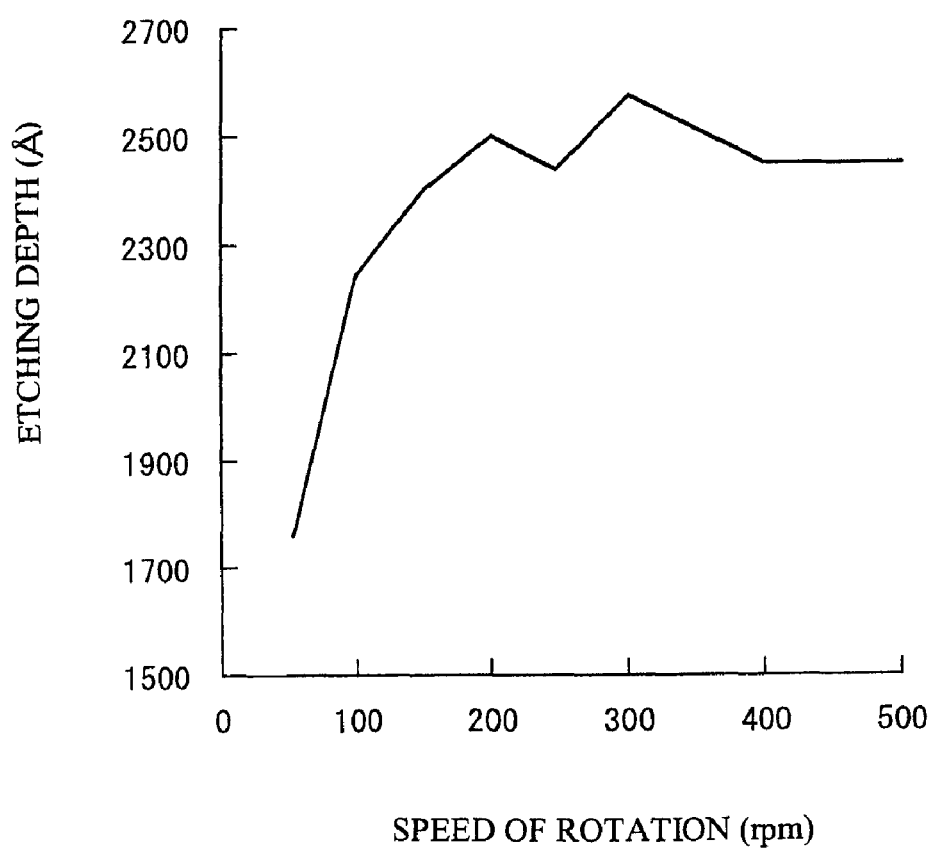
FIG. 23 is a graph showing the result of measurement concerning a corresponding relation between speed of rotation and etching depth in Experiment 6.

The result is shown in FIG. 23. It was known that the etching rate can be adjusted by changing the speed of rotation as in Experiment 1.

COMPARATIVE EXPERIMENT EXAMPLE 1

The inventors carried out a comparative experiment using the same apparatus as the apparatus M6 in the sixth embodiment. However, the exhaust pump 80 was stopped and the suction exhaust was not carried out through the suction port parts 81c, 81b. Etching was carried out under the following conditions.
film component: $SiO_2$
film thickness: 2500 Å
processing gas: $CF_4$
blow-off flow rate: 4 l/min.
processing time: 30 sec.
speed of rotation: 250 rpm As a result, the etching range was spread up to the main area of the wafer. It was unable to obtain the reproducibility of the etching width.

The present invention is not limited to the above-mentioned embodiment, but many other embodiments can be employed without departing from the spirit of the present invention.

The present invention is not limited to etching but it can likely be applied to such other plasma surface processing as cleaning, CVD, surface modification, ashing and the like.

The present invention is not only limited to plasma surface processing under generally normal pressure but also it can be applied to plasma surface processing under reduced pressure.

INDUSTRIAL APPLICABILITY

The present invention can be applied to plasma etching of a semiconductor base material, for example.

The invention claimed is:

1. A plasma processing apparatus in which a processing gas is plasmatized, and blown off, so that an outer edge of a wafer, having a major surface, is subjected to plasmatizing process, said apparatus comprising:
a nozzle head, said head being disposed on one side of said major surface, having:
a pair of electrodes forming a gas passage passing said processing gas and plasmatizing said processing gas therebetween;
a blow-off part being provided with a blow-off port connected to said gas passage and having a port axis which is intersected with said major surface of the wafer, said port being dimensioned small enough in diameter or in width so as not to allow said blow-off stream to be blown off directly to a part of said wafer which part is located at the more internal side of said wafer than the outer edge of said wafer and not to be subjected to plasmatizing process;
a suction part being provided with a suction port disposed proximate to said blow-off port, said suction port forming a suction stream oriented generally in the reverse direction with respect to said blow-off stream,
wherein the blow off stream and the suction stream are disposed on said one side of said major surface, and wherein a side periphery of a first area where the blow off stream is formed and a side periphery of a second area where the suction stream is formed are continued directly on said one side of said major surface;
wherein said blow off part includes a partition wall whose one peripheral surface constitutes a peripheral surface of said blow off port and whose the other peripheral surface constitutes a peripheral surface of said suction port, said blow-off port and suction port being partitioned by said partition wall, said partition wall being dimensioned as to be reduced in thickness toward a distal end of said partition wall; and
wherein a distal end of said partition wall has a knife edge-like configuration, thereby said blow-off port and suction port are generally contacted with each other at the distal edge of said partition wall.

2. A plasma processing apparatus according to claim 1, wherein said blow-off port has a spot-like configuration; and
said suction port has an annular configuration surrounding said spot-like blow-off port.

3. A plasma processing apparatus according to claim 1, wherein said blow-off port extends arcuately along the outer edge of said wafer, and said suction port includes at least one of an arcuate outer suction port part extending along the outer edge of said arcuate blow-off port and an arcuate inner suction port part extending along the inner edge of said arcuate blow-off port.

4. A plasma processing apparatus according to claim 1, further comprising
a nozzle head for receiving therein said pair of electrodes, said blow-off part and said suction part; and
a rotary device that relatively rotates said nozzle head along the outer edge of said wafer.

5. A plasma processing apparatus according to claim 1, wherein said blow-off port is slightly radially outwardly expanded from said wafer.

6. A plasma processing apparatus according to claim 1, further comprising a rotary device that rotates said wafer at a predetermined speed of rotation about a center axis of said wafer.

7. A plasma processing apparatus according to claim 6, wherein said rotary device includes a wafer support part for supporting said wafer by being abutted with only a back surface of said wafer and a rotation driver to rotate said wafer support part.

8. A plasma processing apparatus according to claim 1, further comprising an air-stream forming device that forms an air-stream on an outer edge periphery of said wafer, said air-stream having a predetermined force oriented in the direction away from said wafer.

9. A plasma processing apparatus according to claim 8, wherein
said air-stream forming device is a rotary device that rotates said wafer about the center axis of said wafer.

10. A plasma processing apparatus according to claim 1, further comprising a processing width setter that sets a processing width of said wafer, and a flow rate adjuster that adjusts a flow ratio of the suction flow rate with respect to the blow-off flow rate in accordance with the set processing width.

11. A plasma processing apparatus according to claim 1 further comprising a working distance adjuster that adjusts an interval, i.e., working distance, between said blow-off port and said wafer.

12. A plasma processing apparatus according to claim 9, wherein said rotary device includes a wafer support part for supporting said wafer by being abutted with only a back surface of said wafer and a rotation driver to rotate said wafer support part.

* * * * *